United States Patent
Hagiwara et al.

(10) Patent No.: US 7,629,911 B2
(45) Date of Patent: Dec. 8, 2009

(54) HIGH-PRECISION MULTI-BAND PASS ΔΣ MODULATOR

(75) Inventors: Hiroyuki Hagiwara, Isesaki (JP);
Atsushi Motozawa, Ashikaga (JP);
Haruo Kobayashi, Kiryu (JP); Hao San, Kiryu (CN)

(73) Assignee: National University Corporation Gunma University, Gunma (JP)

( * ) Notice: Subject to any disclaimer, the term of this patent is extended or adjusted under 35 U.S.C. 154(b) by 50 days.

(21) Appl. No.: 12/096,021

(22) PCT Filed: Aug. 1, 2006

(86) PCT No.: PCT/JP2006/315200

§ 371 (c)(1),
(2), (4) Date: Jun. 3, 2008

(87) PCT Pub. No.: WO2007/066431

PCT Pub. Date: Jun. 14, 2007

(65) Prior Publication Data

US 2009/0167581 A1    Jul. 2, 2009

(30) Foreign Application Priority Data

Dec. 9, 2005    (JP) .............................. 2005-356688

(51) Int. Cl.
*H03M 3/00* (2006.01)

(52) U.S. Cl. ....................... 341/143; 341/155

(58) Field of Classification Search ................ 341/143, 341/155

See application file for complete search history.

(56) References Cited

U.S. PATENT DOCUMENTS 5,392,042 A * 2/1995 Pellon ........................ 341/143
7,095,350 B2 * 8/2006 Hagiwara et al. ........... 341/150

FOREIGN PATENT DOCUMENTS

| JP | 07-312555 | 11/1995 |
|---|---|---|
| JP | 2002-353815 | 12/2002 |
| JP | 2004-509500 | 3/2004 |
| JP | 2005-535229 | 11/2005 |
| JP | 2006-013704 | 1/2006 |
| JP | 2006-013705 | 1/2006 |

OTHER PUBLICATIONS

Hao San et al., "A Noise-Shaping Algorithm of Multi-bit DAC Nonlinearities in Complex Bandpass ΔΣAD Modulators", IEICE TRANS. Fundamentals, vol. E87-A. No. 4, Apr. 2004, pp. 792-800.
Hao San et al., "An Element Rotation for Multi-bit, DAC Nonlinearities in Complex Bandpass ΔΣAD Modulators", Proceedings of the 17th International Conference on VLSI Design (VLSID'04), 2004, pp. 151-156.

* cited by examiner

*Primary Examiner*—Khai M Nguyen
(74) *Attorney, Agent, or Firm*—Hogan & Hartson LLP

(57) ABSTRACT

A high-precision ΔΣ modulator reduces nonlinear noise due to the use of a multibit DAC and has little hardware and power consumption. A digital signal is DA converted and fed back to a subtraction circuit supplied with an analog signal. The DAC used in this feedback circuit uses a DAC (DWADAC) that includes a weighted pointer so that input digital signals are supplied in order to a plurality of segment elements that construct the DAC. In this DWADAC, the construction and number of the pointer is set based on the type and order of the filter disposed before the ADC.

12 Claims, 35 Drawing Sheets

FIG. 1
(a)
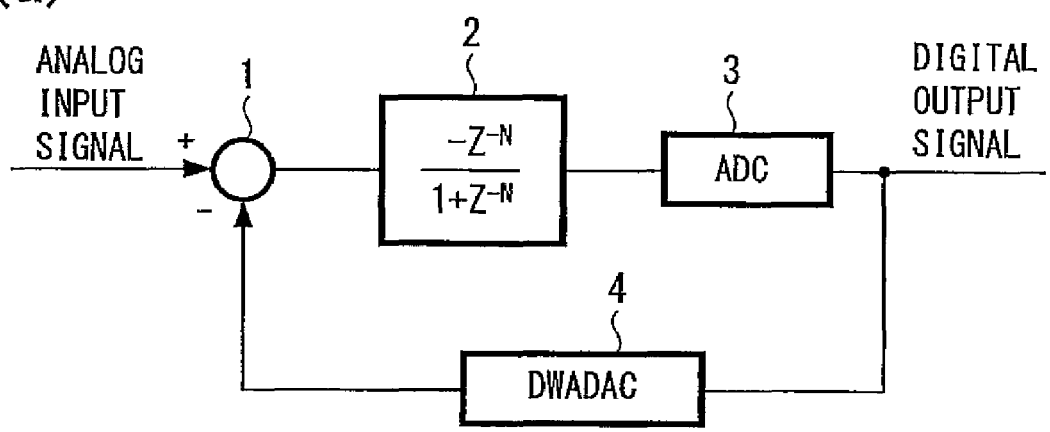
(b)
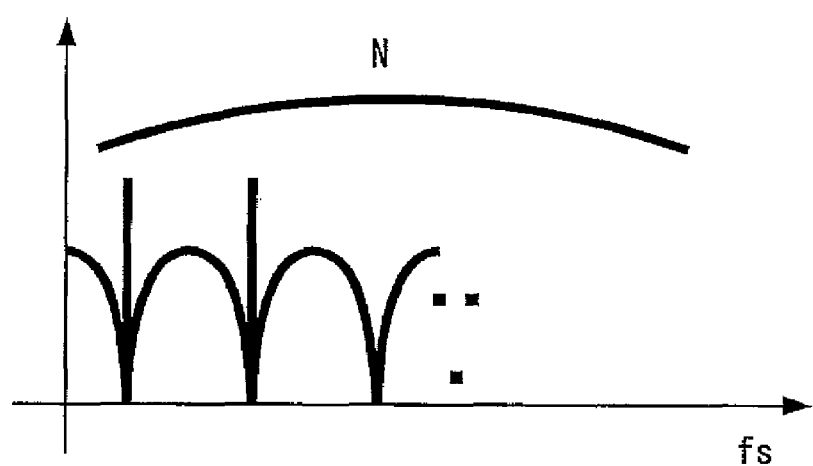

N=4

FIG. 8
N=1
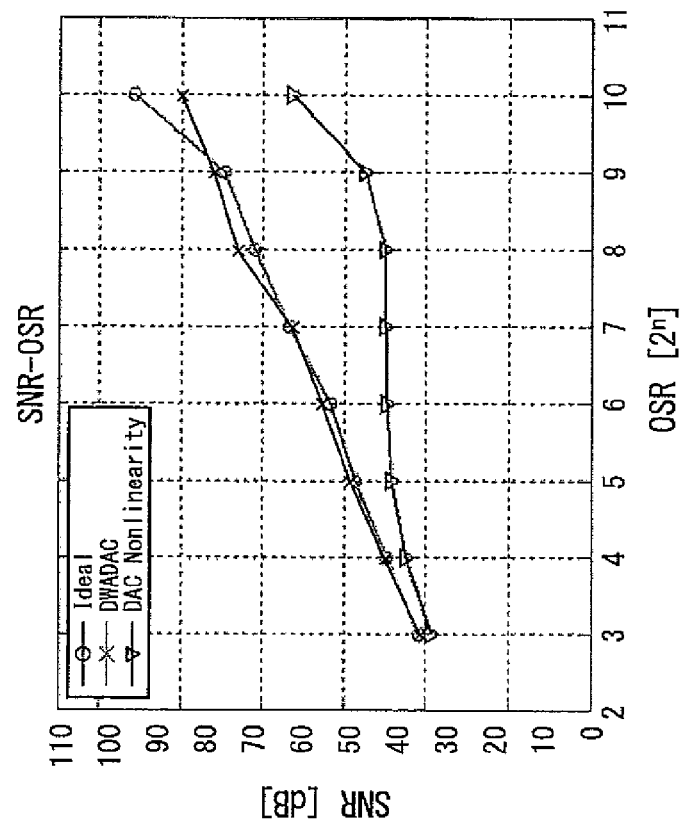
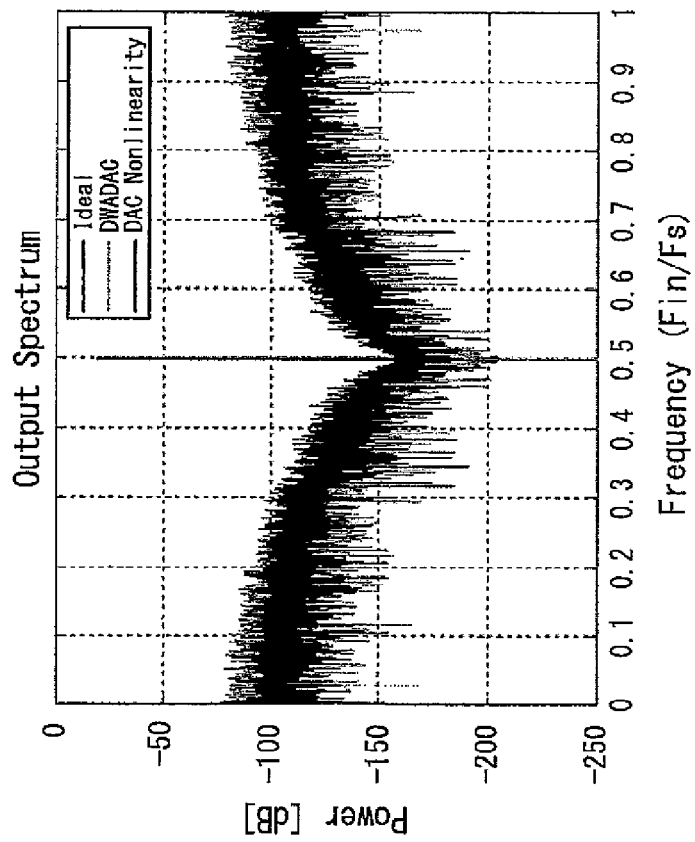

FIG. 9
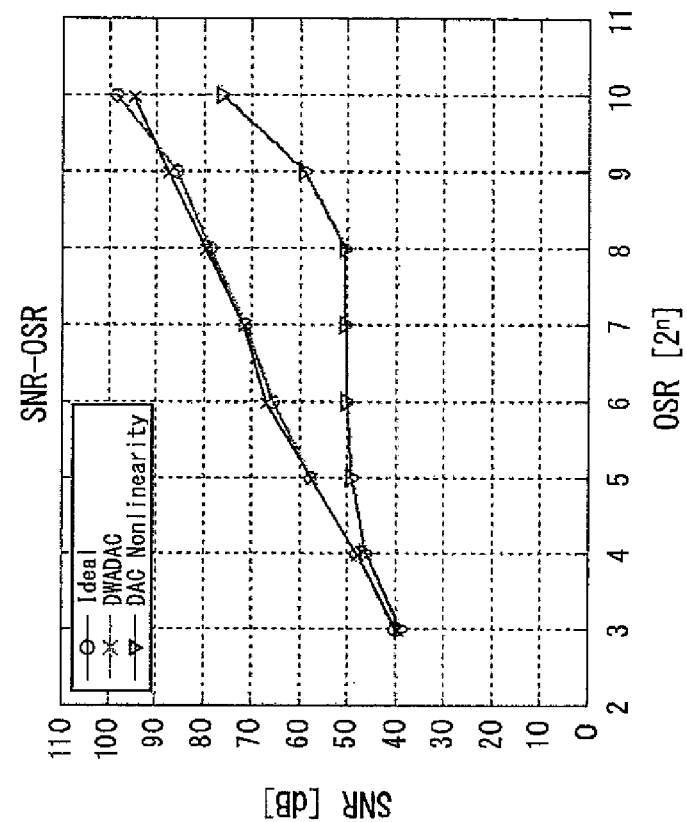
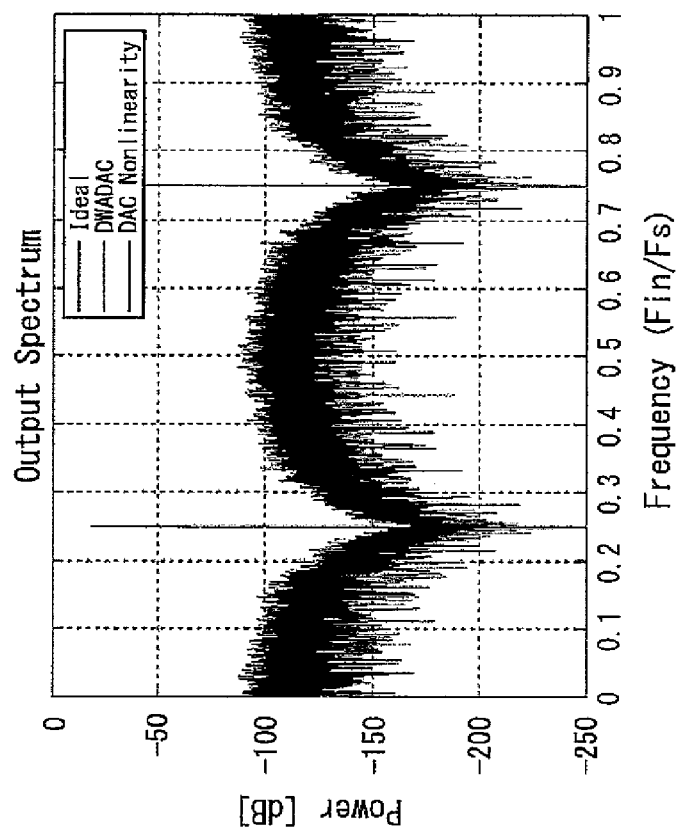

FIG. 13
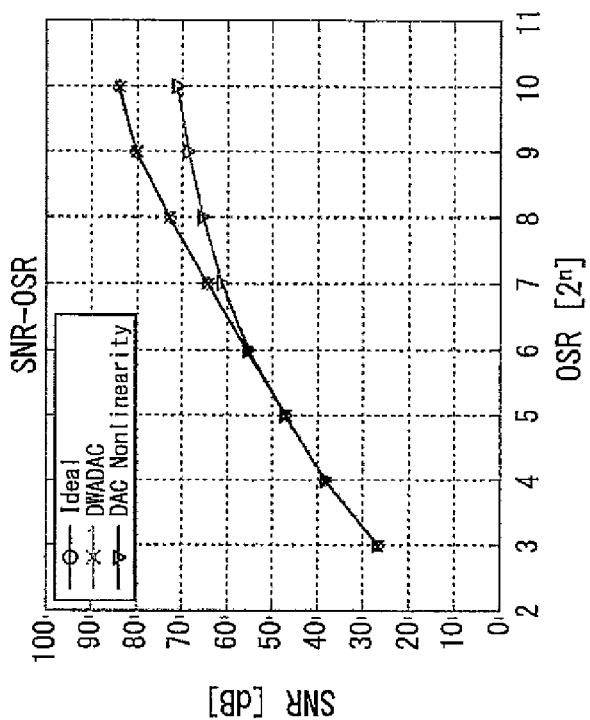
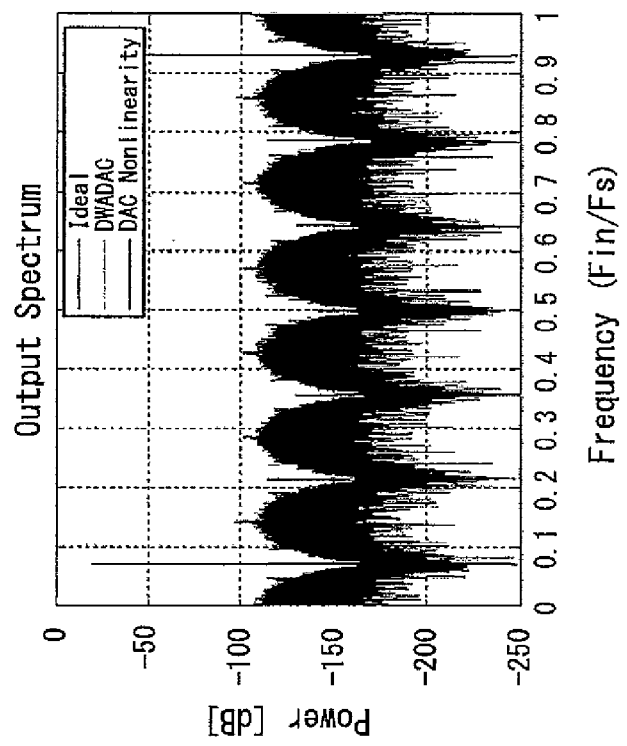

FIG. 14
N=8
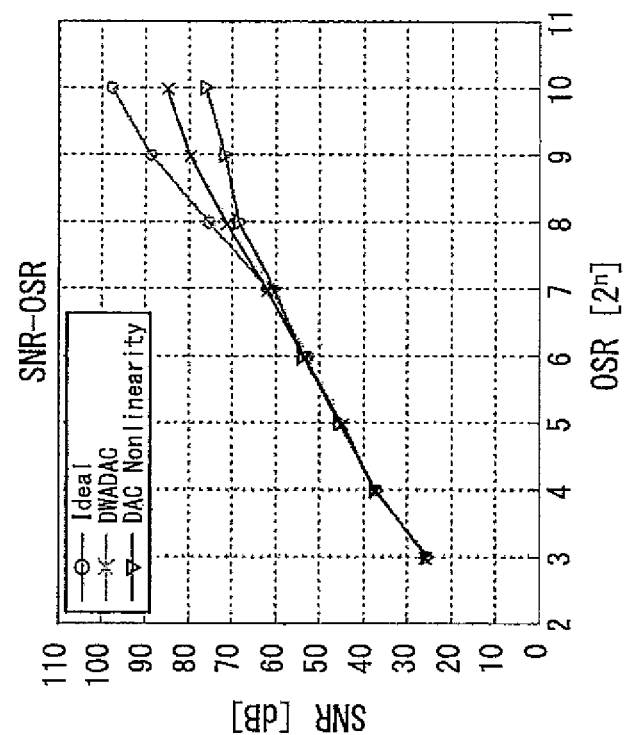
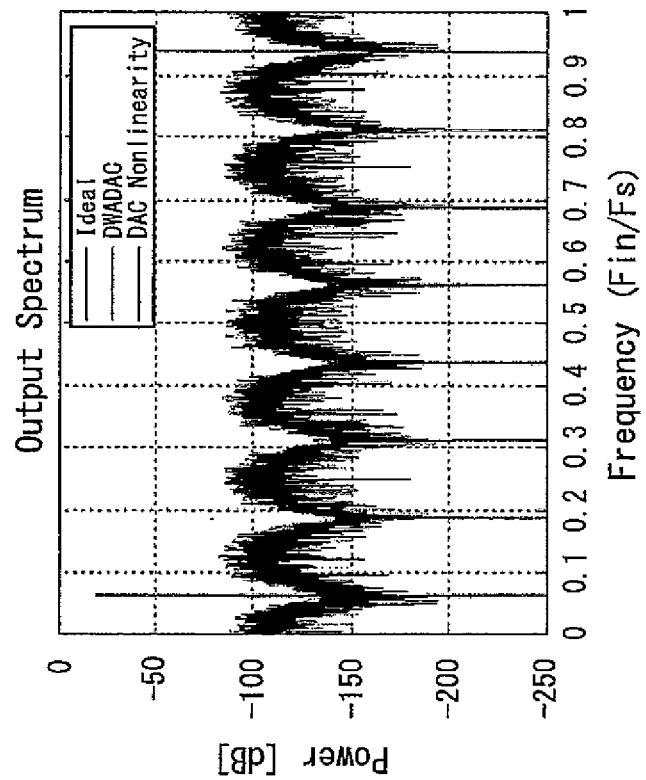

FIG. 20
N=4
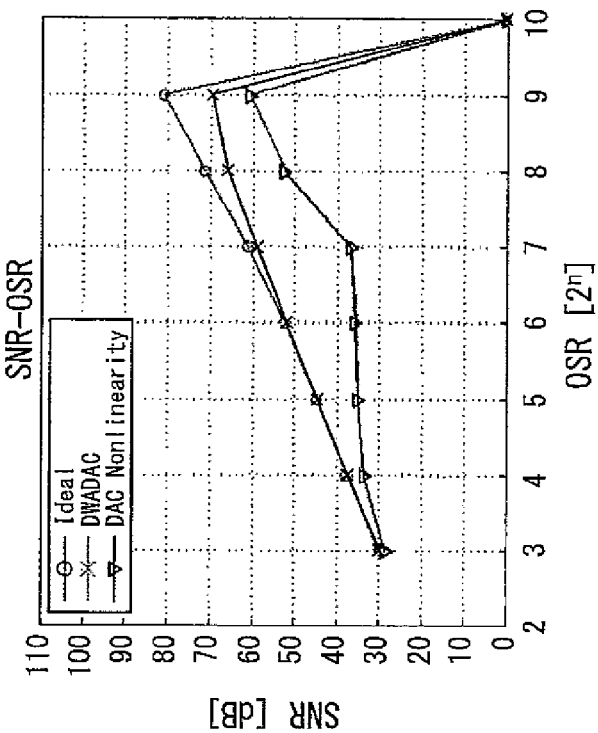
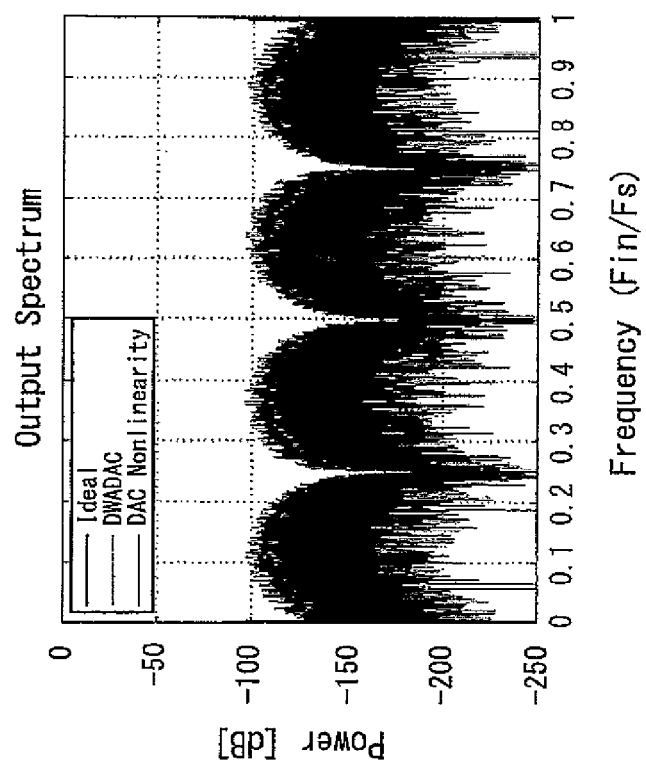

FIG. 21
N=1
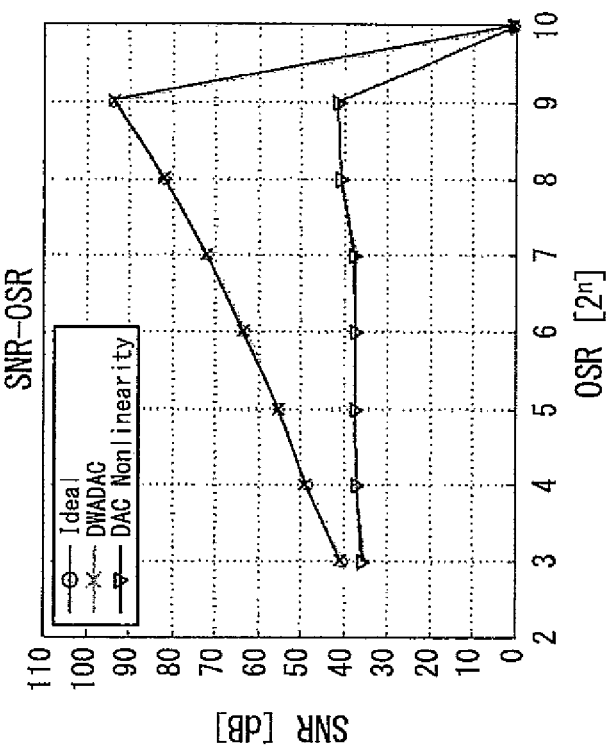
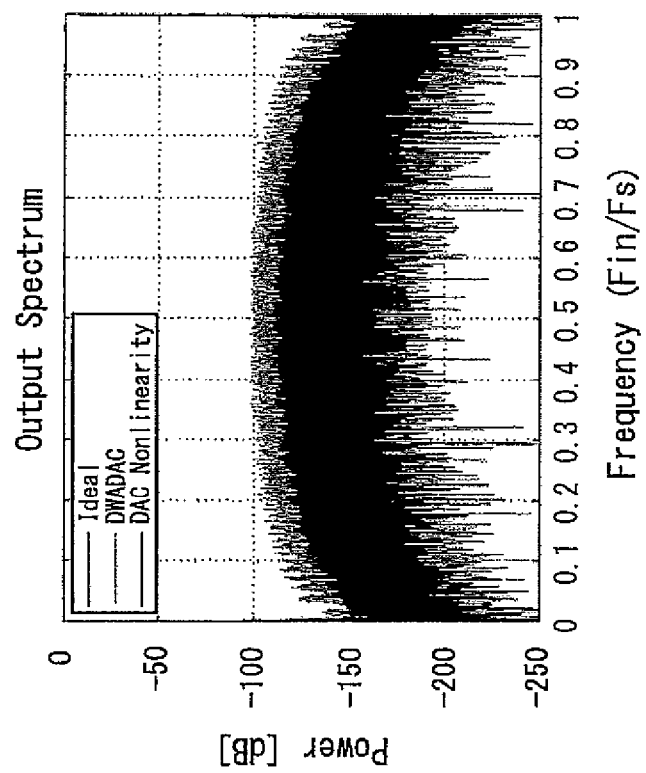

FIG. 22
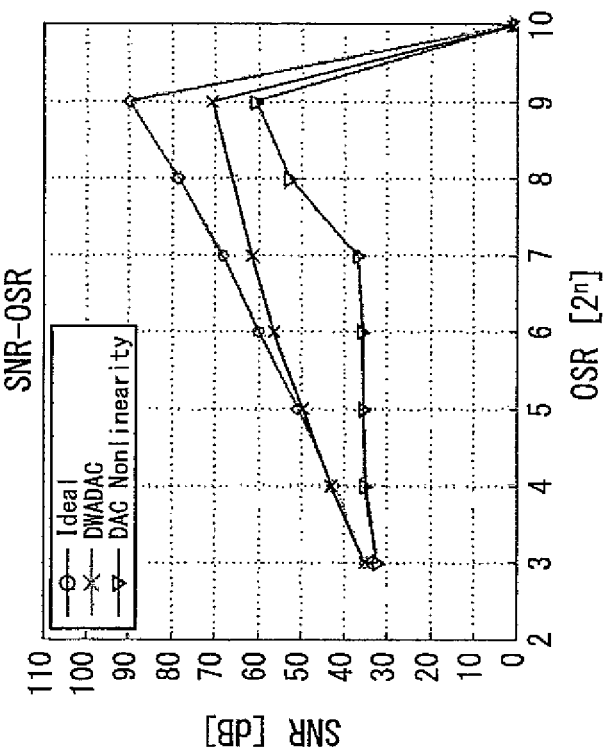
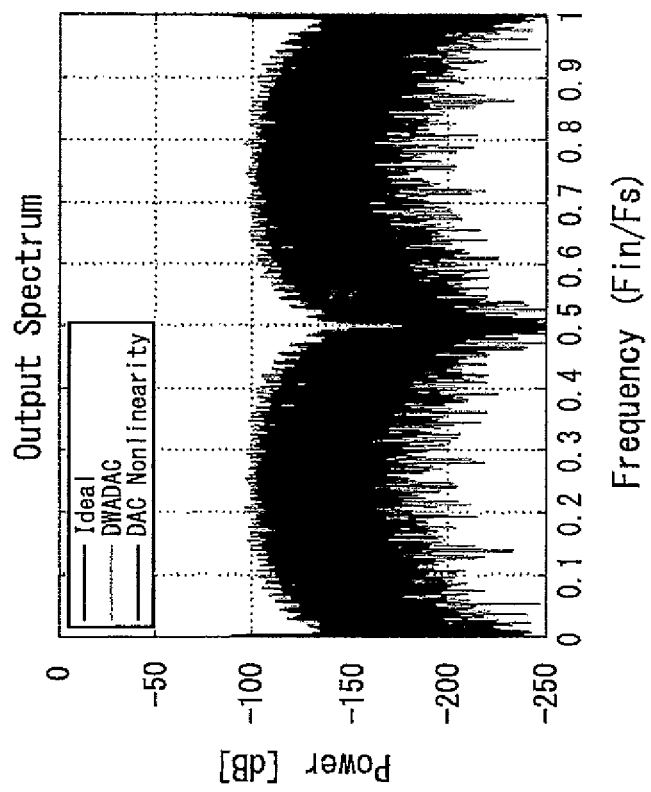

FIG. 23
N=3
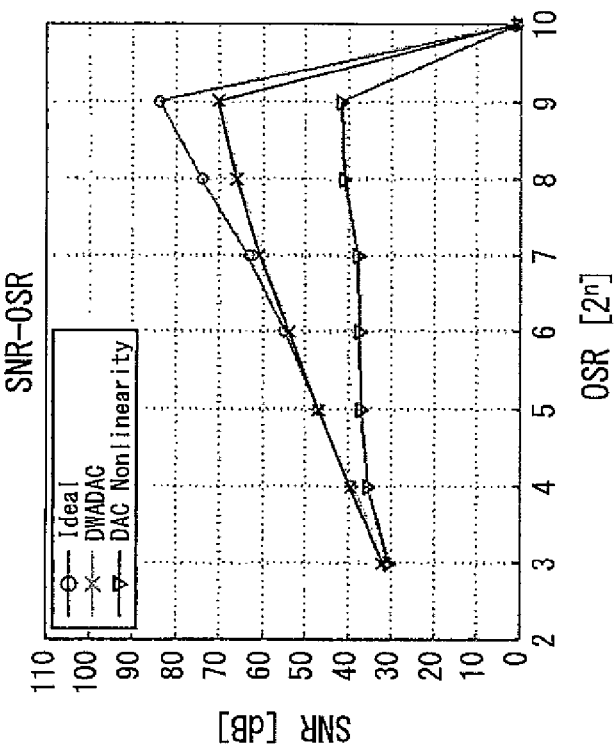
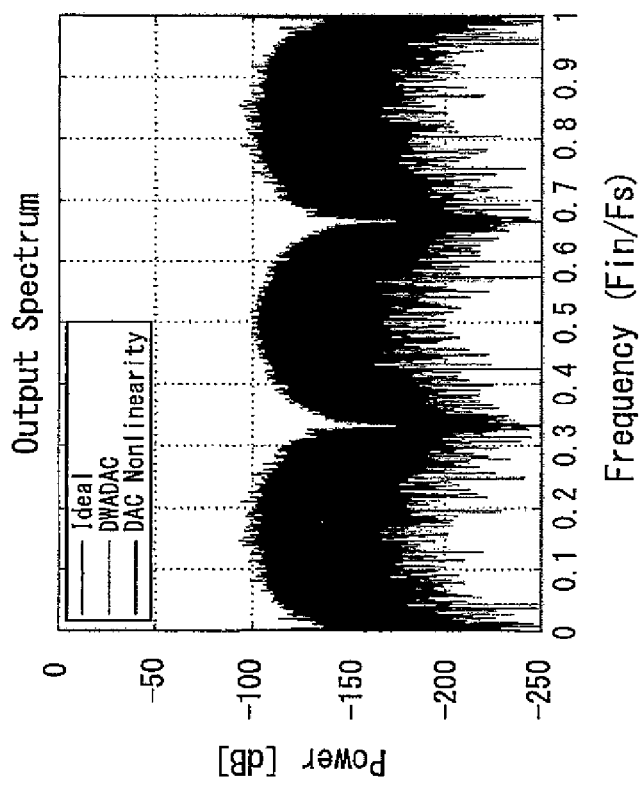

FIG. 24
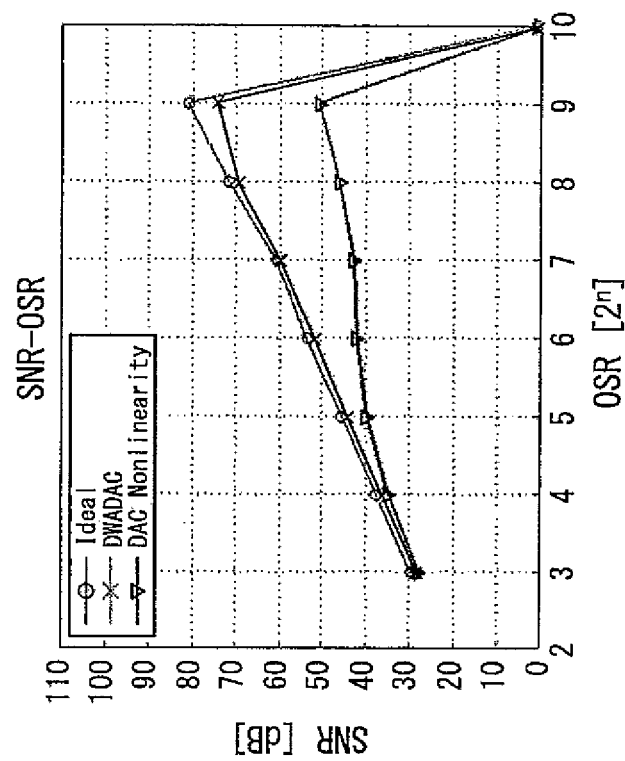
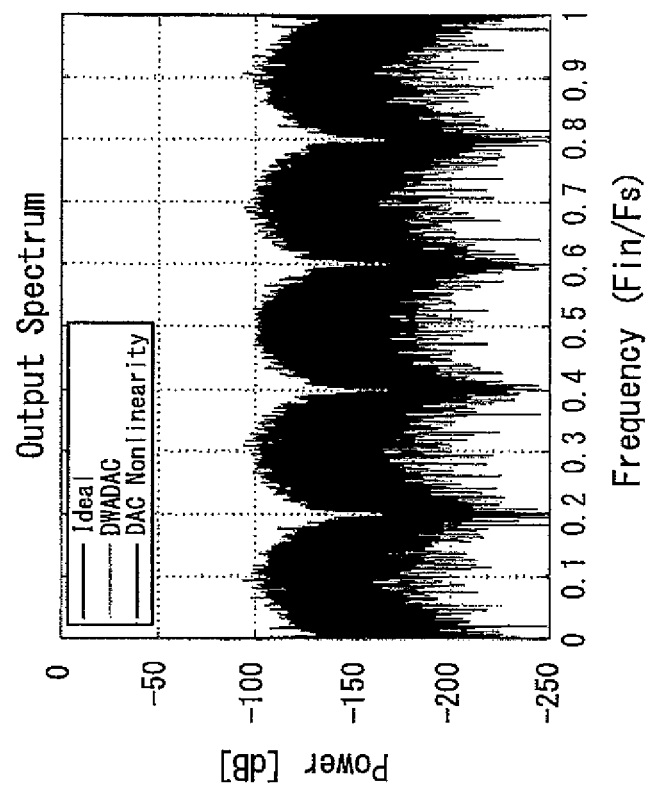

FIG. 25
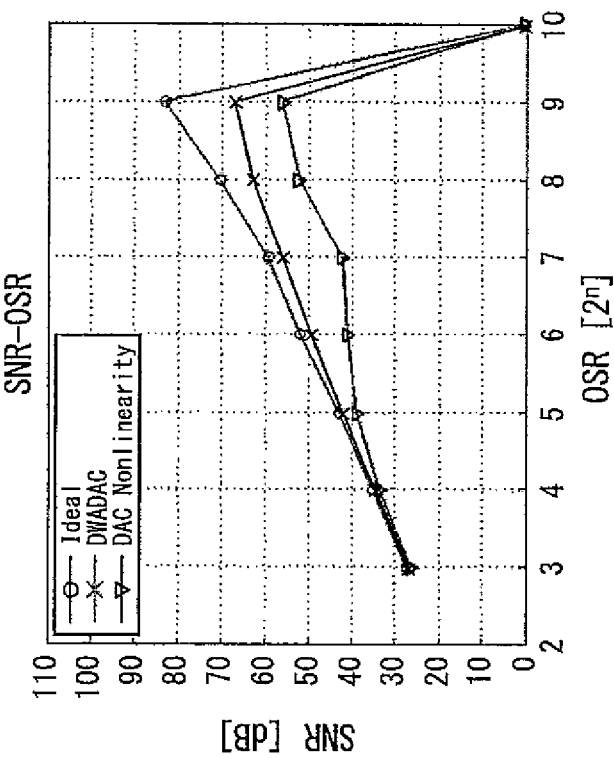
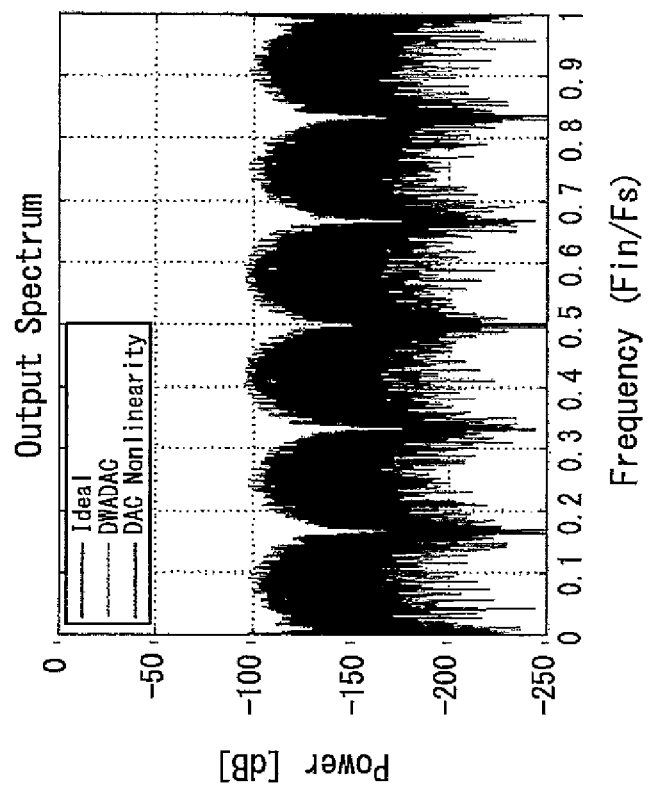

FIG. 26
N=7
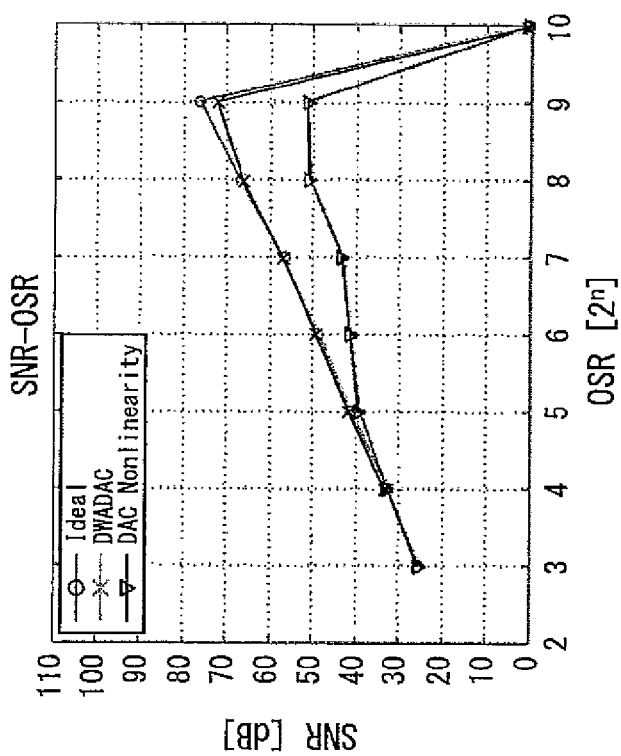
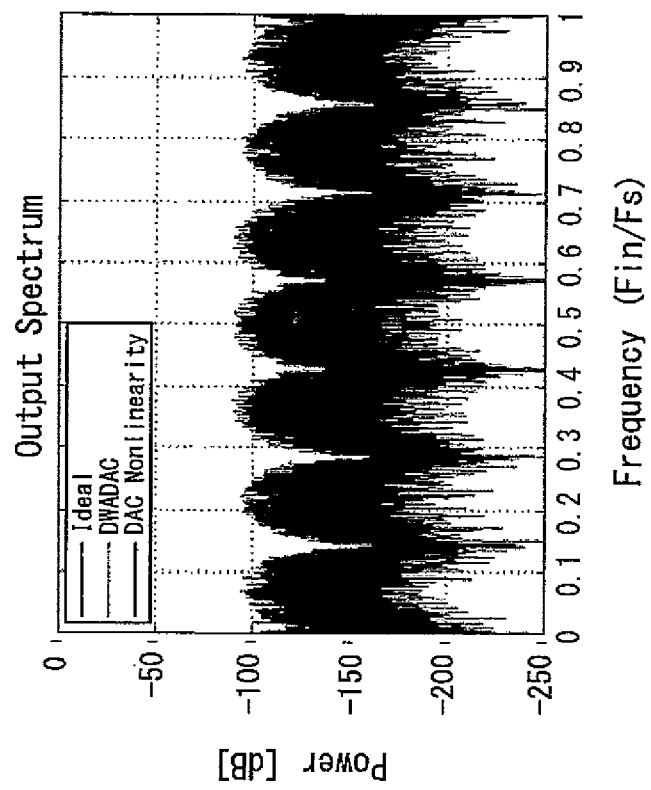

FIG. 27
N=8
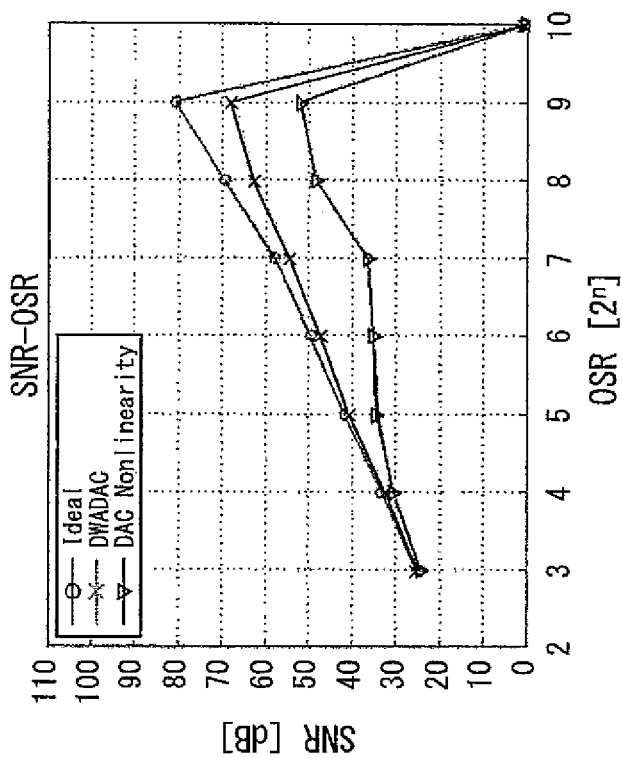
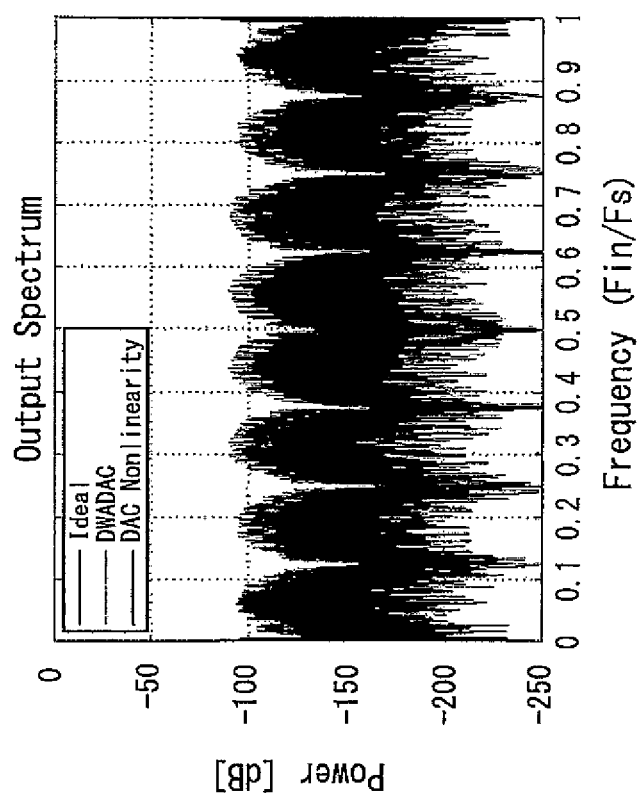

FIG. 30
RESULT OF AVOIDING IMAGE
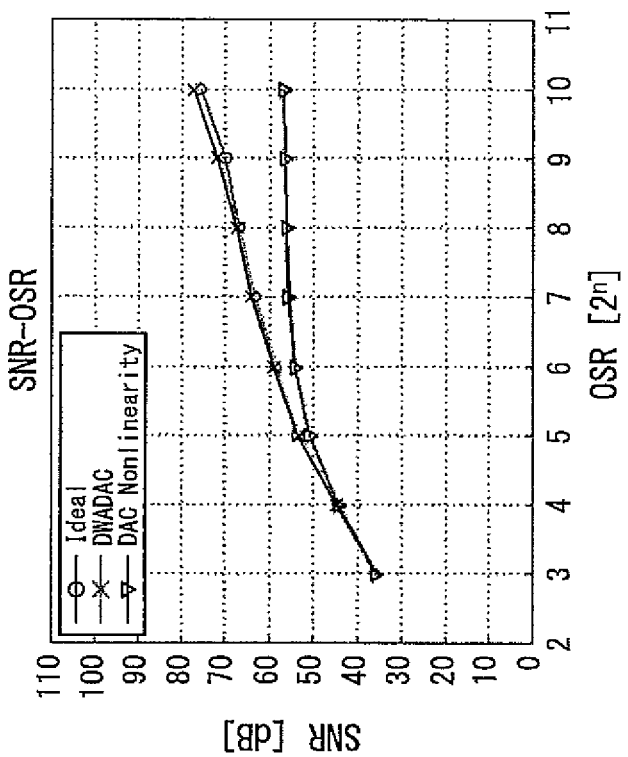
(a)
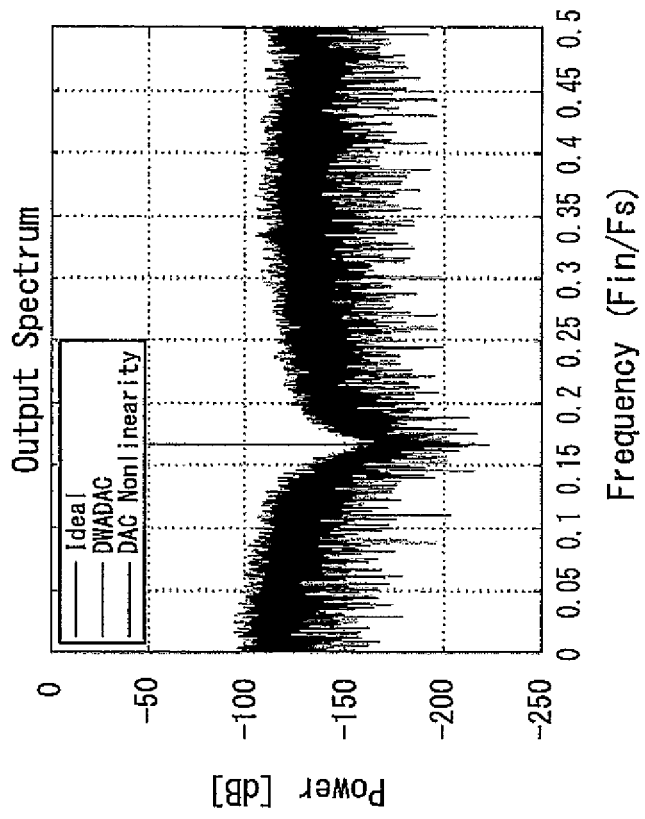
(b)

HIGH-PRECISION MULTI-BAND PASS ΔΣ MODULATOR

TECHNICAL FIELD

The present invention relates to a ΔΣ modulator that uses a multi-band pass filter with N zero points, and in particular to a high-precision multi-band pass ΔΣ modulator that uses a multibit DAC (Digital Analog Converter) within a feedback circuit system inside the modulator.

BACKGROUND ART

In recent years, research has been carried out into utilizing a ΔΣ modulator that uses a multi-band pass filter in an RF receiver circuit of a communication system such as a mobile telephone or a wireless LAN (Local Area Network). This is because when a multi-band pass ΔΣ modulator is used, quantization noise inside an ADC (Analog Digital Converter) is reduced within the signal band, and it is possible to improve the precision of the digital output (this method is called "noise shaping"). A ΔΣ modulator has further advantages in that the analog circuit scale is small and it is possible to realize high-precision AD conversion in a low-precision device.

In this way, although ΔΣ modulators have been widely used in the past as a system that can realize a high-precision AD converter by means of high-speed oversampling and a noise shaping method and in particular as an audio AD converter, when a multibit ΔΣ modulator is used to achieve even higher precision, there is the problem that the nonlinearity of the DAC inside the modulator is not subjected to noise shaping. Because of this, there has been an inconvenience of deterioration in the overall precision of the ADC.

FIG. 34 is a block diagram that is useful in explaining the generation of noise due to the nonlinearity of a multibit DAC, where FIG. 34(a) is a block construction diagram and FIG. 34(b) shows an equivalent circuit.

As shown in FIG. 34(a), the inputted analog signal X(Z) is supplied to one input of a subtractor 100. The output of the subtractor 100 is supplied to an N-order multiple band filter 101 (whose transmission function is expressed as H(Z)) and only signal components within the band are extracted there and supplied to a multibit ADC 102. The multibit ADC 102 converts the inputted analog signal to a digital signal, but as shown in FIG. 34(b), quantization noise E(Z) is added with the AD conversion. This quantization noise decreases as the number of bits is increased. Accordingly, a multibit ADC has less quantization noise compared to a one-bit ADC.

The digital output Y(Z) produced by the AD conversion is supplied via a multibit DAC 103 to the other input of the subtracter 100. Inside the multibit DAC 103, δ noise is superimposed (see FIG. 34(b)). This δ noise is nonlinear noise that is characteristic to the multibit DAC 103 and is caused by variation in the elements, such as capacitors, that construct the DAC 103. The relationship between Y(Z) and X(Z) from the equivalent circuit shown in FIG. 34(b) is as shown in Equation (1).

Equation (1)

$$Y(Z) = \frac{H(Z)}{1+H(Z)}(X(Z) - \delta(Z)) + \frac{1}{1+H(Z)} \cdot E(Z) \quad (1)$$

Nonlinear noise δ (Z) will now be described. FIG. 35 shows the digital-analog conversion characteristics of a one-bit DAC (shown by the straight line) compared to the digital-analog conversion characteristics of multibit conversion (shown by the broken line). As shown in FIG. 35, although nonlinear noise does not appear with a one-bit DAC, nonlinear noise is produced when a multibit DAC is used. This is due to errors caused by the nonlinearity of the elements that construct the multibit DAC.

One example construction of the multibit DAC 103 and the operation thereof are shown in FIG. 36. As shown in FIG. 36(a), the multibit DAC 103 includes eight capacitors $C_0$ to $C_7$, an operational amplifier (op amp) 104, a feedback capacitor $C_s$ and switches $S_0$ to $S_7$. These capacitors $C_0$ to $C_7$ are obviously not all manufactured exactly the same and there are some fluctuations in the respective capacitance values. If the mismatches due to such fluctuation are expressed as $e_0$, $e_1, \ldots, e_7$ and the average value of $C_0$ to $C_7$ is expressed as C, it is possible to express as $C_0$=C+$e_0$, $C_1$=C+$e_1$, ..., $C_7$=C+$e_7$.

When an input signal with a value that is one of 0 to 7 is supplied to the input, a corresponding number of capacitors are charged and the charged voltages are outputted via the feedback capacitor $C_s$ that is connected to the inverting terminal of the op amp and the output terminal. Here, if the input signal is "m" (where m=3, for example), the switches $S_0$, $S_1$, and $S_2$ in FIG. 36 are switched on and the capacitors $C_0$, $C_1$, and $C_2$ are charged with the reference voltage $V_{ref}$. The voltage that is charged in these capacitors is extracted via the feedback capacitor $C_s$ as the output voltage $V_{out}$.

The output voltage $V_{out}$ at this time is shown in Equation (2).

Equation (2)

$$V_{out} = -m\frac{C}{C_s}V_{ref} + \delta \quad (2)$$

where $\delta=(e_0+e_1+ \ldots +e_7)V_{ref}/C_s$ is the reference voltage supplied to the switches $S_0$ to $S_7$.

The nonlinear noise δ due to the use of the multibit DAC 103 is caused by fluctuations in the values of the capacitors $C_0$ to $C_7$ of the DAC 103, but this is because due to the characteristics of the multibit DAC, the capacitors $C_0, C_1, \ldots, C_6$, $C_7$ are charged in that order regardless of the value of the input digital signal. That is, as shown in FIG. 36(b), when the values 4, 3, 2, 2, ... are successively supplied as inputs, since the switches are switched on in the order $S_0$ to $S_7$ corresponding to the inputted number, there are many cases where the capacitors $C_0, C_1, \ldots$, are always on, and the capacitors $C_7$, $C_6, \ldots$, seldom become on.

To solve this problem, as shown in FIG. 37(a), a method has been taken in which the capacitors $C_0$ to $C_7$ are connected to form a ring. According to this method, when "4" is inputted first, the capacitors $C_0$ to $C_3$ are switched on. If "3" is inputted next, the capacitors $C_4$ to $C_6$ are switched on. By successively switching on the eight capacitors $C_0$ to $C_7$ in this way, it is possible to solve the problem described above. FIG. 37(b) is a diagram useful in explaining the operation of this DAC. This method has not reached actual use due to poor design efficiency, but it is already known in papers as a segmented DAC where current cells are arranged in a ring. (see Non-Patent Document 1).

Non-Patent Document 1: San Hao, Kobayashi, Kawakami, Wada "A Noise Shaping Algorithm for Multibit DAC Nonlinearities in Complex Band Pass ΔΣAD Modulators" (Proceedings of 16th Karuizawa Workshop on Circuits and Systems, pp 85 to 90)

Non-Patent Document 2: S. Bommalingaiahnapallya, R. Bommalingaiahnapallya, and R. Harjani "EXTENDED NOISE-SHAPING IN CASCADED N-TONE ΣΔCONVERTERS", (Fifth International Conference on Advanced AD and DA Conversion, Techniques and Their Applications, Limerick Ireland (July 2005).)

DISCLOSURE OF THE INVENTION

However, the technology disclosed in Non-Patent Document 1 is applied to nonlinear noise shaping in a multibit DAC used in a band pass ΔΣ A D modulator, and is effective for only a single signal band. Also, in the multibit ΔΣ modulator disclosed by non-Patent Document 2, an increased number of analog components are required to achieve high precision, resulting in the problems of increases in the amount of hardware and in power consumption.

The present invention is effective for a plurality of signal bands of a multi-band pass, aims to reduce the overall amount of hardware and power consumption in a low-order filter by using a multibit DAC, and also aims to reduce nonlinear noise of a multibit DAC by providing digital circuits (pointers) in parallel to the multibit DAC.

To achieve the stated aim, a ΔΣ modulator according to the present invention includes: a subtraction circuit that is supplied with an analog signal; a multi-band pass filter that has N zero points and is supplied with an output of the subtraction circuit; an analog-digital conversion circuit that is supplied with an output of the multi-band pass filter that has N zero points and converts the analog signal to a digital signal; and a digital-analog conversion circuit that converts the digital output from the analog-digital conversion circuit to an analog signal and feeds the converted analog signal back to the subtraction circuit, wherein DWA (Data-Weighted Averaging) pointers that supply successively inputted digital signals to a plurality of segment elements that construct the digital-analog conversion circuit are provided in parallel in accordance with center frequencies of the multi-band pass filter.

As a first preferable embodiment of the present invention, the multi-band pass filter that has N zero points is a multi-band pass filter that does not include a DC component in an N-order signal band. As a second preferable embodiment of the present invention, the multi-band pass filter that has N zero points is a multi-band pass filter that includes a DC component in an N-order signal band.

As a third preferable embodiment of the present invention, a ΔΣ modulator includes: a subtraction circuit that is supplied with an analog signal; a band pass filter that is supplied with an output of the subtraction circuit; an analog-digital conversion circuit that is supplied with an output of the band pass filter and converts the analog signal to a digital signal; and a digital-analog conversion circuit that converts the digital output from the analog-digital conversion circuit to an analog signal and feeds the converted analog signal back to the subtraction circuit, wherein the band pass filter is set so that a center frequency of the signal band of the filter part is a center frequency (for example, $f_s/6$) aside from $f_s/4$, where a sampling frequency is expressed as $f_s$, and DWA pointers that supply successively inputted digital signals to a plurality of segment elements that construct the digital-analog conversion circuit are provided in parallel in accordance with the center frequency of the band pass filter. When the signal frequency is set in this way, it is possible to solve the problem of an image signal being produced at a position found by folding over centered on $f_s/4$ and to improve the SNDR (Signal Noise Distortion Ratio) of the signal band part.

In addition, a fourth preferred embodiment of the present invention is a ΔΣ modulator including: a subtraction circuit that is supplied with an analog signal; a multi-band pass filter that is supplied with an output of the subtraction circuit; an analog-digital conversion circuit that is supplied with an output of the multi-band pass filter and converts the analog signal to a digital signal; and a digital-analog conversion circuit that converts the digital output from the analog-digital conversion circuit to an analog signal and feeds the converted analog signal back to the subtraction circuit, wherein the multi-band filter is constructed such that center frequencies of signal bands of the filter part are composed of center frequencies aside from a center frequency expressed as $f_s/4$ where $f_s$ is a sampling frequency, and when the center frequencies of the signal bands are expressed as $(2n+1)f_s/2N$ or $nf_s/N$, n is a value aside from a certain odd value (as one example, the center frequencies are $f_s/16$, $5f_s/16$, $7f_s/16$ (2N=16)), and weighted pointers (DWADAC) that supply successively inputted digital signals to a plurality of segment elements that construct the digital-analog conversion circuit are provided in parallel in accordance with the center frequencies of the signal bands of the multi-band pass filter. Eight pointers are provided in the DWADAC corresponding to this embodiment, and by doing so it is possible to construct a transmission path that deliberately excludes a band that is susceptible to attenuation due to outside influences and/or is used by other communication (in this example, the signal band with the center frequency of $3f_s/16$). That is, by selecting the carrier for transmission and reception, it is possible to prevent adverse effects on the transmission path.

Although the DWADAC used in the ΔΣ modulator according to the present invention is realized by adding a plurality of digital circuits (that is, pointers) to a normal segmented DAC, as such pointers, a construction produced by disposing a plurality of multi-band pass filters that have N zero points and do not include a DC component in an N-order signal band (a high-pass algorithm construction) or a plurality of multi-band pass filters that have N zero points and include a DC component in an N-order signal band (a low-pass algorithm construction) in parallel in accordance with the order of the filter is used in accordance with the filter being used.

According to the ΔΣ modulator according to the present invention, digital circuits (pointers) that reduce the influence of nonlinearity are provided in parallel to the multibit DAC that is used inside a feedback loop inside a multibit ΔΣ modulator, and therefore it is possible to effectively remove nonlinear noise due to the characteristics of the multibit DAC.

BRIEF DESCRIPTION OF THE DRAWINGS

FIG. 1 is a block diagram of a ΔΣ AD modulator that uses a multi-band pass filter (HP filter) that has N zero points and does not include a DC component in an N-order signal band, which is a first embodiment of the present invention.

FIG. 8 is composed of graphs showing the output spectrum (a) and the SNR relative to the OSR for a case where the order of the HP filter is "1" in the first embodiment of the present invention.

FIG. 9 is composed of graphs showing the output spectrum (a) and the SNR relative to the OSR for a case where the order of the HP filter is "2" in the first embodiment of the present invention.

FIG. 13 is composed of graphs showing the output spectrum (a) and the SNR relative to the OSR for a case where the order of the HP filter is "7" in the first embodiment of the present invention.

FIG. 14 is composed of graphs showing the output spectrum (a) and the SNR relative to the OSR for a case where the order of the HP filter is "8" in the first embodiment of the present invention.

FIG. 20 is composed of graphs showing the output spectrum (a) and the SNR relative to the OSR (b) for a case where the order of the LP filter is "4" in the second embodiment of the present invention.

FIG. 21 is composed of graphs showing the output spectrum (a) and the SNR relative to the OSR (b) for a case where the order of the LP filter is "1" in the second embodiment of the present invention.

FIG. 22 is composed of graphs showing the output spectrum (a) and the SNR relative to the OSR (b) for a case where the order of the LP filter is "2" in the second embodiment of the present invention.

FIG. 23 is composed of graphs showing the output spectrum (a) and the SNR relative to the OSR (b) for a case where the order of the LP filter is "3" in the second embodiment of the present invention.

FIG. 24 is composed of graphs showing the output spectrum (a) and the SNR relative to the OSR (b) for a case where the order of the LP filter is "5" in the second embodiment of the present invention.

FIG. 25 is composed of graphs showing the output spectrum (a) and the SNR relative to the OSR (b) for a case where the order of the LP filter is "6" in the second embodiment of the present invention.

FIG. 26 is composed of graphs showing the output spectrum (a) and the SNR relative to the OSR (b) for a case where the order of the LP filter is "7" in the second embodiment of the present invention.

FIG. 27 is composed of graphs showing the output spectrum (a) and the SNR relative to the OSR (b) for a case where the order of the LP filter is "8" in the second embodiment of the present invention.

FIG. 30 is composed of graphs showing the output spectrum (a) and the SNR relative to the OSR for a case where the center frequency of the band pass filter in the third embodiment of the present invention is set aside from $f_s/4$ at $f_s/6$ and three HP pointers are used.

BEST MODE FOR CARRYING OUT THE INVENTION

Figure 2:
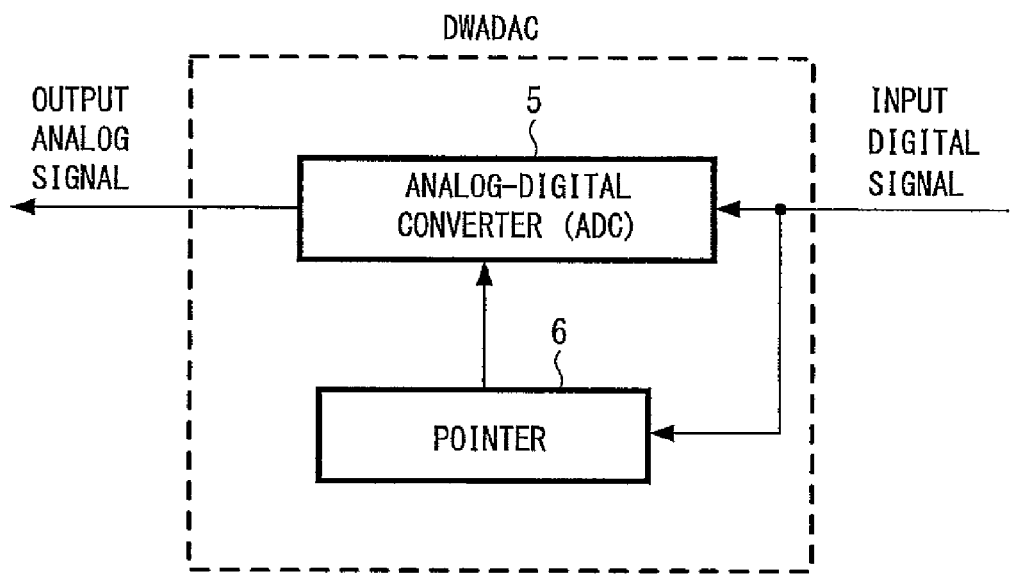
FIG. 2 is a diagram showing the schematic construction of a DWADAC used in the first embodiment of the present invention.

A multi-band pass ΔΣ modulator that is one embodiment of the present invention will now be described with reference to the attached drawings.

FIG. 1(a) is a block construction diagram showing the construction of a multi-band pass ΔΣ modulator for carrying out analog to digital conversion using a DWADAC, for the case where a multi-band pass filter 2 that has N zero points and does not include a DC component in an N-order signal band is used. FIG. 1(b) is a graph showing the relationship between signal frequencies in the frequency band and the noise level.

As shown in FIG. 1(a), the present embodiment of the invention includes a subtractor 1, to one terminal of which an input analog signal X(Z) is supplied, the multi-band pass filter 2 (hereinafter abbreviated to "HP filter" for convenience) that is supplied with the output of the subtractor 1 and has N zero points and does not include a DC component in an N-order signal band, a normal multibit ADC 3 that converts the output from the HP filter 2 to a digital signal Y(Z), and a DWADAC 4 that converts the output of the multibit ADC 3 to an analog signal and supplies the analog signal to the other terminal of the subtractor 1.

Here, since the transmission function of the HP filter can be expressed as $H(Z)=-Z^{-N}/(1+Z^{-N})$ where N is the order of the filter, by substituting this into Equation (1), the relationship between the input analog signal X(Z) and the output digital signal Y(Z) can be expressed as shown in Equation (3) below.

Equation (3)

$$Y(Z)=-Z^{-N}\cdot\{X(Z)-\delta(Z)\}+E(Z)(1+Z^{-N}) \quad (3)$$

(where E(Z) is the quantization noise and δ(Z) is the nonlinear noise of the DAC)

Here, the two physical values STF(Signal Transfer Function) and NTF(Noise Transfer Function) are newly defined as follows. STF and NTF are defined as shown in Equations (4) and (5), respectively. As can be understood from these equations, STF shows the output proportion of the signal component and NTF shows the output proportion of the noise component. That is, the sum of STF and NTF is "1", thereby showing that the output value is the sum given by adding the signal component and the noise component.

Equation (4)

$$STF = \frac{Y(Z)}{X(Z)} = \frac{H(Z)}{1+H(Z)} \quad (4)$$

Equation (5)

$$NTF = \frac{Y(Z)}{E(Z)} = \frac{1}{1+H(Z)} \quad (5)$$

By substituting the transmission function $H(Z)=-Z^{-N}/(1+Z^{-N})$ into Equations (4) and (5), Equations (6) and (7) are given.

Equation (6)

$$STF=-Z^{-N} \quad (6)$$

Equation (7)

$$NTF=1+Z^{-N} \quad (7)$$

FIG. 1(b) shows the relationship and the effect of quantization noise relative to signal bands centered on signal frequencies $f_n$. The signal band center frequencies $f_n$ are given by $f_n=(2n+1)f_s/2N$ (where n=0, 1, 2, . . . , $f_s$ is the sampling frequency, and N is the order of the filter). From FIG. 1(b), it can be understood that there is a remarkable reduction in quantization noise near the center frequencies of the signal bands.

Next, the DWADAC 4 used in FIG. 1(a) is described in brief. FIG. 2 schematically shows the overall construction of the DWADAC 4. As shown in FIG. 2, the DWADAC 4 includes a normal DAC 5 that converts an input analog signal to a digital signal and a pointer 6 that indicates the position of a segment element that constructs the DAC 5.

Figure 3:
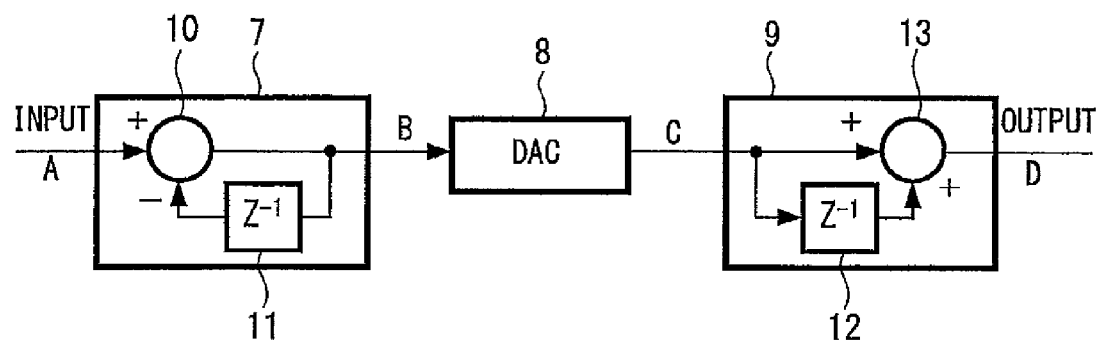
FIG. 3 is an image diagram of an HP block construction that constructs the pointer of the DWADAC of the first embodiment of the present invention.

FIG. 3 is an image block diagram schematically showing the construction of the pointer 6 and the DAC 5 in order to explain the operation thereof. As described later, the DWA-DAC 4 has a circuit construction in which a digital-analog conversion process is carried out by switching between a plurality of the basic construction blocks shown in FIG. 3.

The operation of a high-pass algorithm construction will now be described based on the schematic image diagram in FIG. 3. FIG. 3 is an image construction diagram of an HP block that constructs the pointer 6 (see FIG. 2) of the DWA-DAC 4 and is applied to a ΔΣ modulator such as that shown in FIG. 1 that uses a multi-band pass filter (or HP filter) that has N zero points and does not include a DC component in an N-order signal band. In this HP block image construction diagram, a digital differentiation circuit 7 is provided before a DAC 8 and an analog integration circuit 9 is provided after the DAC 8.

The inputted digital signal is supplied to one input terminal of a subtractor 10. Data produced by an immediately preceding subtraction is supplied to the other input terminal of the subtractor 10 via a delay circuit 11. This data is subtracted from the newly inputted data. The digital differentiation circuit 7 is constructed by the feedback loop of the subtractor 10 and the delay circuit 11. The differentiated digital signal is converted to an analog signal by the normal DAC 8, and the converted analog signal is supplied to an adder 13. The analog signal is also supplied to the other terminal of the adder 12 via a delay circuit 12. The adder 13 and the delay circuit 12 construct the analog integration circuit 9.

First, the operation of the DWADAC 4 shown in FIG. 2 will be described based on the image block construction diagram shown in FIG. 3. FIG. 4(a) to FIG. 4(c) are diagrams useful in explaining such operation. FIG. 4(a) is a diagram showing the operation in the case where the number of segment elements constructing the pointer 6 is infinite, while FIG. 4(b) is a diagram showing the operation in the case where the number of segment elements is limited to eight. FIG. 4(c) is a diagram showing how the values of A to D in the image block construction diagram in FIG. 3 change.

Assume that digital signals are supplied in the order "3, 2, 3, 2" into input A as shown in FIG. 4(a) to 4(c). First, "3" is given as input A. At this time, since the output of the delay circuit 11 is "0", output B of the subtractor 10 remains at "3". Accordingly, output C of the DAC 8 is also "3", and segment elements 0, 1, and 2 are switched on (shown by the symbol "+" in FIG. 4(a)).

Next, when "2" is supplied to input A, since the held value "3" is subtracted from the input data "2", the output B of the subtractor 10 becomes "-1". That is, the output C of the DAC 8 becomes "-1". However, since the previous value "3" that is the output of the delay circuit 13 is added to "-1" in the adder 12 that is provided after the DAC 8, the output D of the adder 12 becomes "2", so that the digital input (A="2") is outputted as the analog output (D="2"). In this case, the segment elements 1, 2 that construct the DAC 8 are switched on. Next, when "3" is inputted into the digital input A, since the previous value "-1" is subtracted in the subtractor 10, the output B of the subtractor 10 becomes "4". For this reason, the analog output C of the DAC becomes "4", but since the previous value "-1" is added by the adder 13 to this "4", the analog output signal D="3" is outputted. As a result, segments 1, 2, 3 of the DAC are switched on.

After this, when a digital signal A=2 is provided, the previous value "4" is subtracted from "2" so that the output of the subtractor B becomes "-2". This "-2" is supplied to the DAC 8 and is converted to an analog signal C (="-2"). The previous value "4" that is the output of the delay circuit 13 is added by the adder 12 to this converted digital signal "-2", and therefore the digital signal D (="2") is outputted.

FIG. 4(b) depicts the above description of FIG. 4(a) using arrows and shows that segment elements 0 to 2 are switched on due to the initial input A (="3") and that segment elements 2, 1 are switched on due to the next input A (="2") with the position of segment element 2 as the starting point. In the same way, segment elements 1, 2, 3 are switched on due to the next input A (="3") this time with the position of segment element 1 as the starting point. The same procedure is then repeated thereafter.

FIG. 4(c) shows the relationship between the values A, B, C, D in FIG. 3. From FIG. 4(c) it can be understood that the input digital signal A is converted to an output digital signal D of the same value regardless of the intermediate path (B, C).

Figure 5:
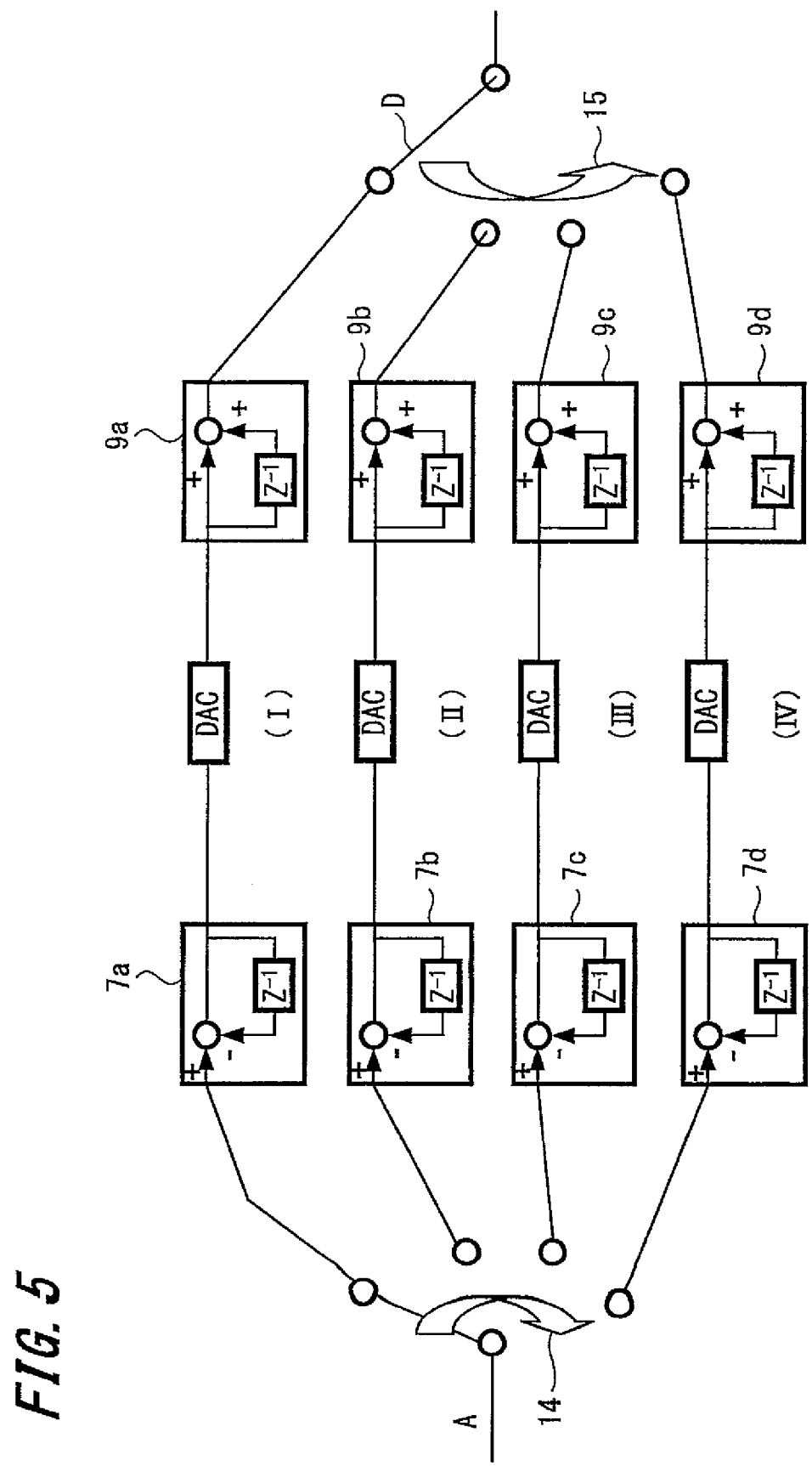
FIG. 5 is an image diagram that uses a plurality (four) of HP block constructions as the pointers of the DWADAC used in the first embodiment of the present invention.
Figure 6:
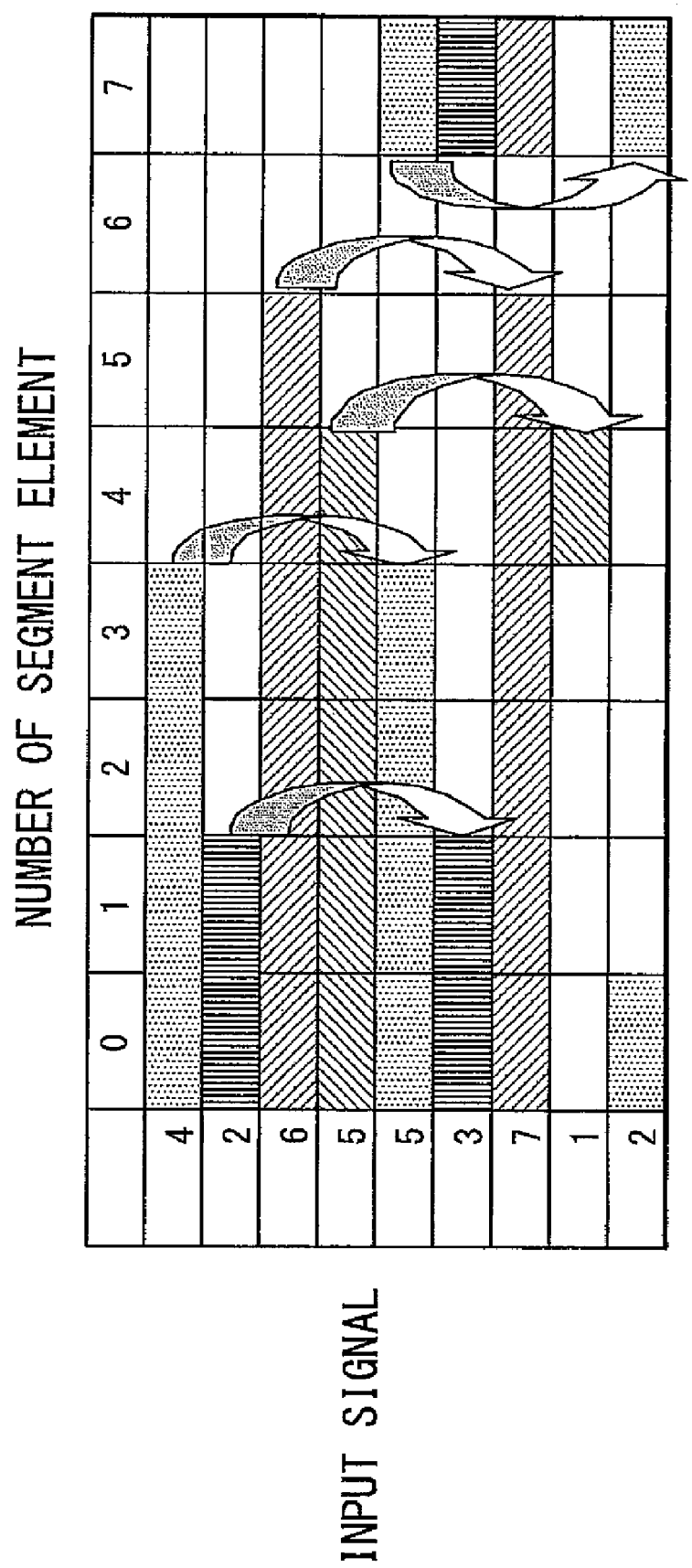
FIG. 6 is a diagram useful in explaining the operation of the DWADAC according to the present invention shown in FIG. 5.

Next, FIG. 5 and FIG. 6 are diagrams useful in showing an example image construction and explaining the operation of the DWADAC 4 of a ΔΣ modulator that uses a multi-band pass filter (HP filter) that has N zero points and does not include a DC component in an N-order signal band, which is the embodiment of the present invention shown in FIG. 1, in a case where, for the DWADAC 4, a plurality (for example, four) pointers 6 (see the HP image block construction diagram in FIG. 3) are provided. The pointers 6 of the DWADAC 4 are set in accordance with the number of center frequencies of the multi-band pass filter 2, and in this case N pointers are provided so as to match the order N of the multi-band pass filter 2. Note that since each HP block image construction diagram that constructs the pointer 6 is no different to that described above with reference to FIG. 3, description thereof is omitted, and the operation thereof will now be described with reference to FIG. 6.

Inputted digital signals are supplied in order to the plurality of DACs (I) to (IV) shown in FIG. 5. That is, the digital input A is supplied via a switch 14 to digital differentiation circuits 7a to 7d that are respectively disposed before the DACs (I) to (IV). The output D is fetched via a switch 15 from analog integration circuits 9a to 9d that are connected after the DACs (I) to (IV). For example, as shown in FIG. 6, when input digital signals are supplied in the order "4, 2, 6, 5, 5, . . . " as digital inputs, "4" is supplied to the DAC (I), "2" is supplied to the DAC (II), "6" is supplied to the DAC (III), and "5" is supplied to the DAC (IV). The next digital input "5" is supplied to the DAC (I) again.

If the order of the HP filter 2 shown in FIG. 1 is fixed and the passbands of the filter are determined, the number of pointer 6 in the DWADAC 4 is set equal to the order of the filter. Here, assume that the order of the HP filter 2 is four and that four HP block constructions are used as the pointers 6 of the DWADAC 4 in accordance with the order of the filter.

Figure 4:
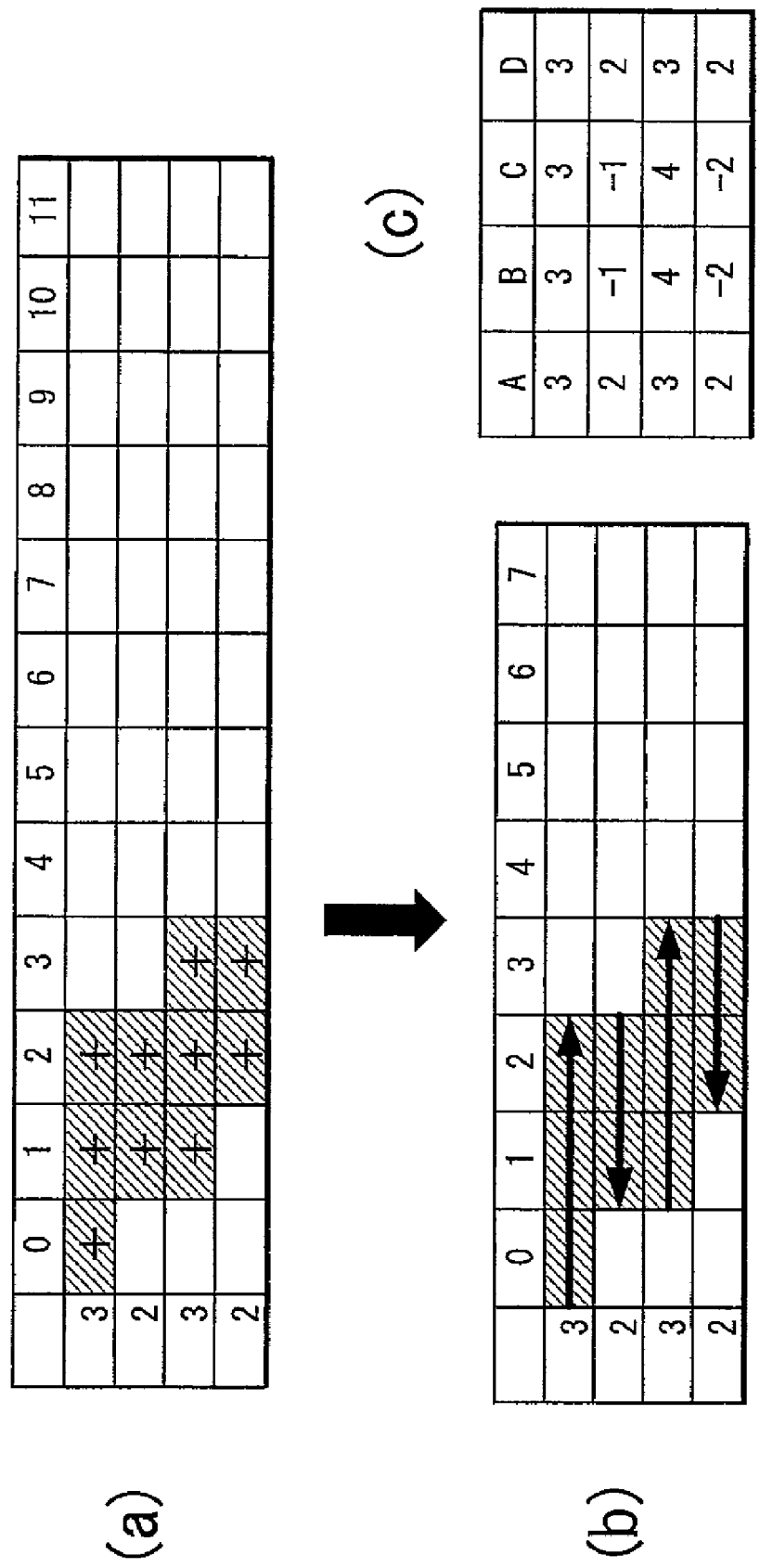
FIG. 4 is a diagram useful in explaining the operation of the HP block construction shown in FIG. 3.

First, when "4" is inputted into the digital input A, since this digital input is supplied via the switch 14 to the DAC (I), as was described with reference to FIG. 3 and FIG. 4, the segment elements 0 to 3 of the DAC (I) are switched on. Next, when the digital signal A (="2") is inputted, the signal is inputted into the HP block construction of the DAC (II), and the segment elements 0, 1 thereof are switched on. After this, when the digital signal A (="6") is inputted, the signal is inputted into the HP block construction of the DAC (III), and the segment elements 0 to 5 thereof are switched on. Also, when the digital signal A (="5") is inputted next, the signal is inputted into the HP block construction of the DAC (IV), and the segment elements 0 to 4 thereof are switched on.

When digital signals have been stored in all of the DAC (I) to the DAC (IV), the next inputted digital signal A (="5") is inputted into the DAC (I) into which the first signal was inputted. At this time, since the DAC (I) operates as was described with reference to FIG. 4(a) to FIG. 4(c), five segment elements are switched on in the order of the segment elements 3, 2, 1, 0, 7. This is the equivalent of proceeding backward from the starting point 3 shown by the pointer to 2, 1, 0 and then finally stopping at 7. When an input signal is next inputted into the DAC (I), the starting point is 7.

In the same way, when the digital input A (="3") is supplied next, the signal is inputted via the switch 14 into the DAC (II) and the segment elements 1, 0, 7 thereof are switched on. Next, when the digital input "7" is supplied, the DAC (III) operates and the segment elements 5, 4, 3, 2, 1, 0, 7 thereof are switched on with the fifth segment element as the starting point. After this, when the digital input A (="1") is inputted, only the segment element 3 of the DAC (IV) is switched on. Next, when the digital signal "2" is inputted, the order returns to the DAC (I) and the segment elements 7, 1 are switched on starting from the starting point 7. In this way, the DACs (I) to (IV) that are a plurality of HP block constructions operate sequentially to carry out a digital to analog conversion process.

Figure 7:
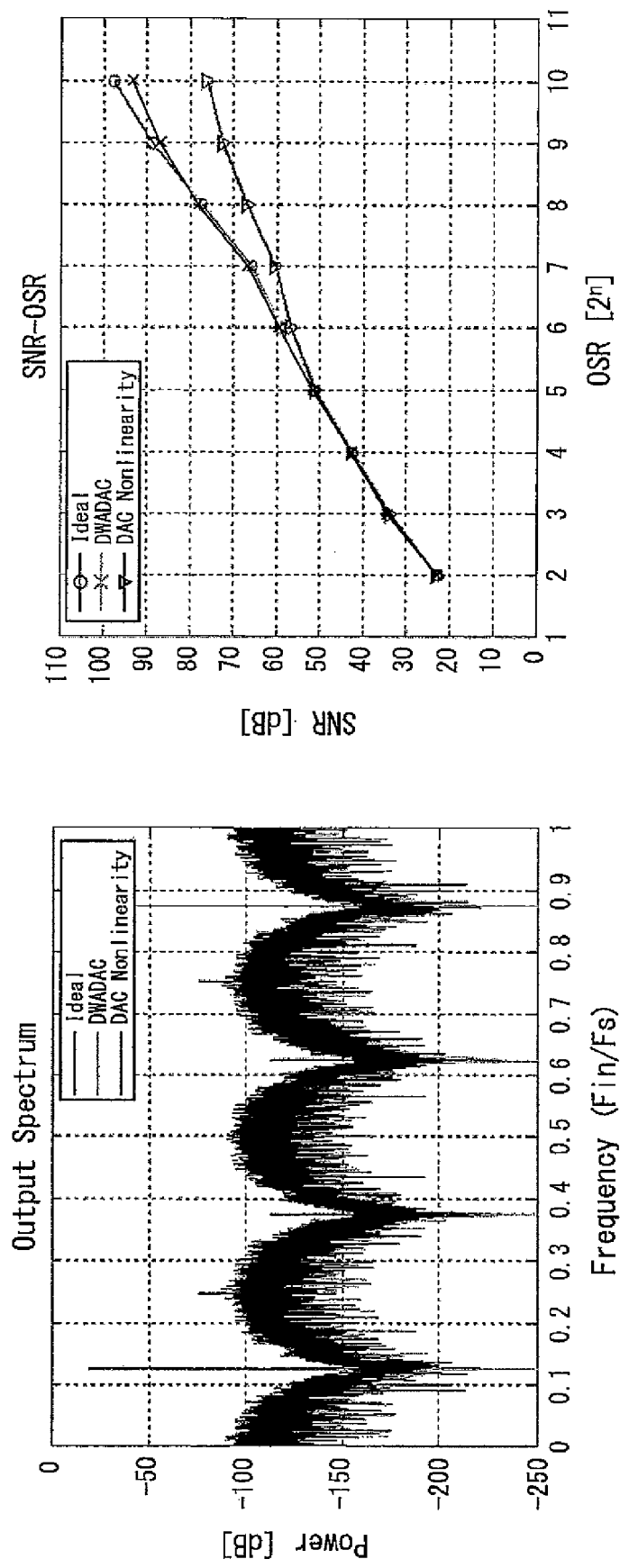
FIG. 7 is composed of graphs showing the output spectrum (a) and the SNR relative to the OSR for a case where the order of the HP filter is "4" in the first embodiment of the present invention.

FIG. 7(a) is a graph showing the output spectrum (dB: output/frequency) for a case where the order of the multi-band pass filter (HP filter) that has N zero points and does not include a DC component in an N-order signal band is four (i.e., N=4) and the DWADAC 4 is composed of four DACs (I) to (IV). FIG. 7(b) is a graph showing the value of the SNR (Signal Noise Ratio) relative to the OSR (Over Sampling Ratio) at this time. In FIG. 7(b), the line marked with the circles shows the SNR in the ideal state where there is no nonlinear noise and the line marked with the triangles shows the case where there is nonlinear noise and a normal DAC is used. The line marked with the crosses shows the case where the DWADAC 4 according to the present embodiment is used. As can be understood from FIG. 7(b), when a DWADAC is used as in the present embodiment, even when nonlinear noise is present, an SNR that is extremely close to the case (shown by the circles) where no nonlinear noise is present is achieved. That is, the efficacy of the use of a DWADAC as a feedback DAC can be confirmed in a multi-band pass ΔΣ modulator with a multi-band pass filter (HP filter) that has N zero points and does not include a DC component in an N-order signal band.

Figure 10:
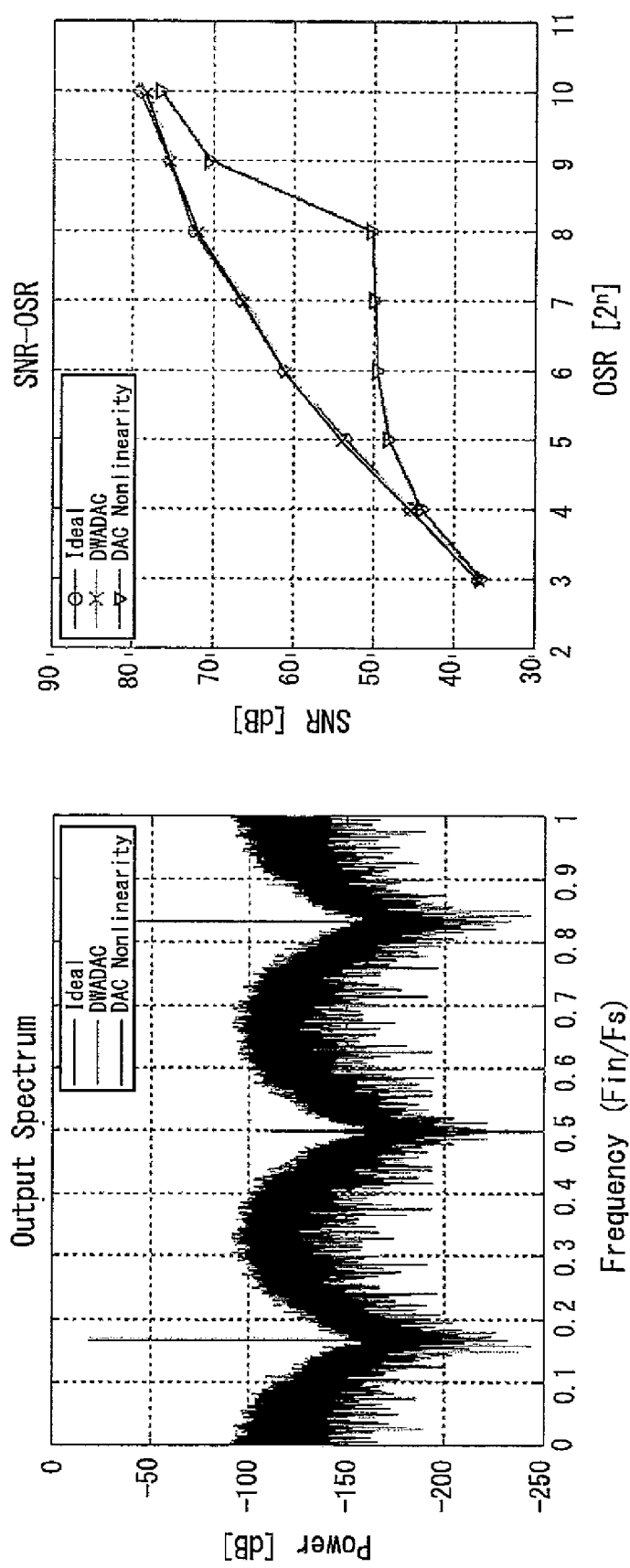
FIG. 10 is composed of graphs showing the output spectrum (a) and the SNR relative to the OSR for a case where the order of the HP filter is "3" in the first embodiment of the present invention.
Figure 11:
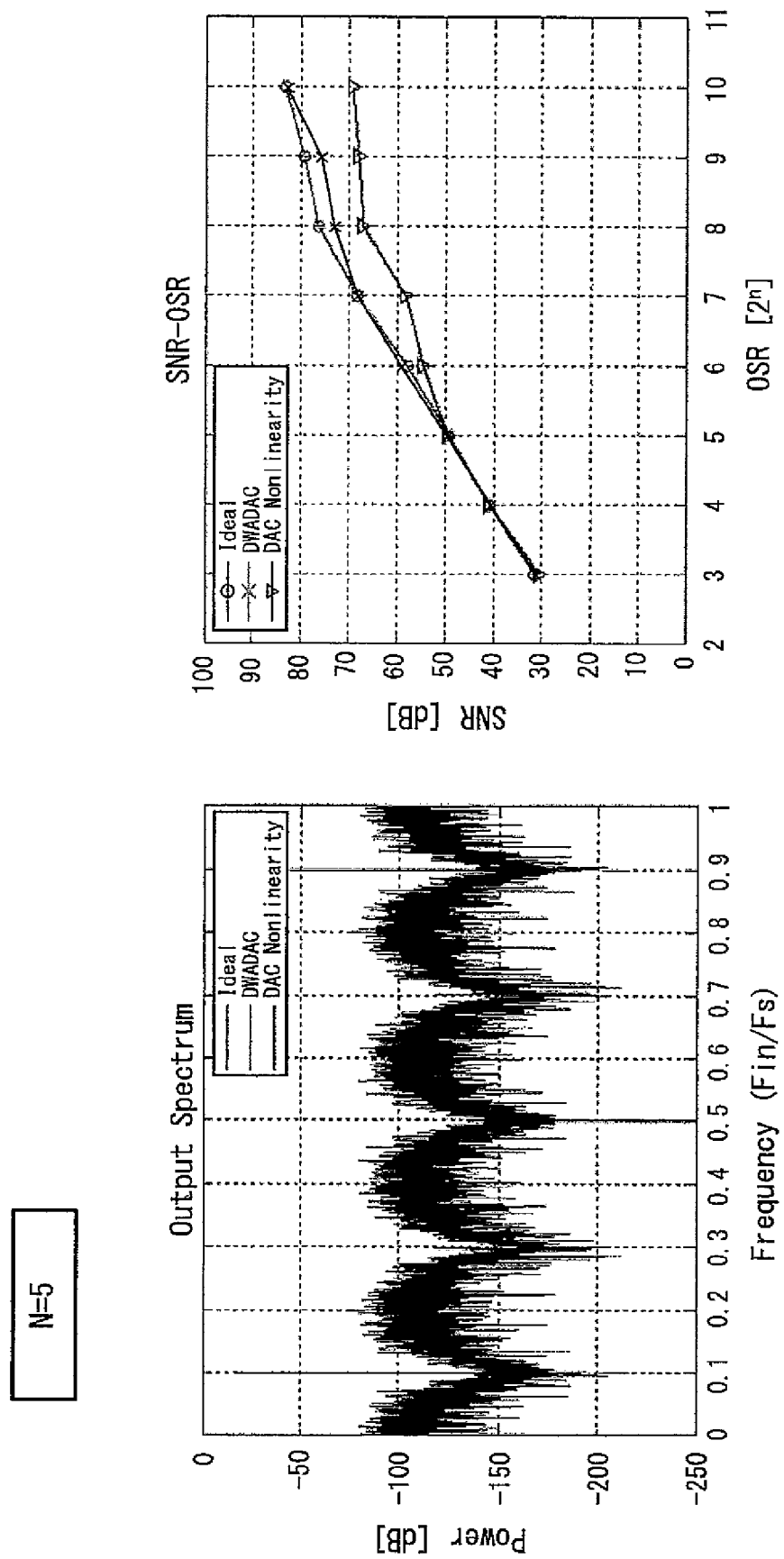
FIG. 11 is composed of graphs showing the output spectrum (a) and the SNR relative to the OSR for a case where the order of the HP filter is "5" in the first embodiment of the present invention.
Figure 12:
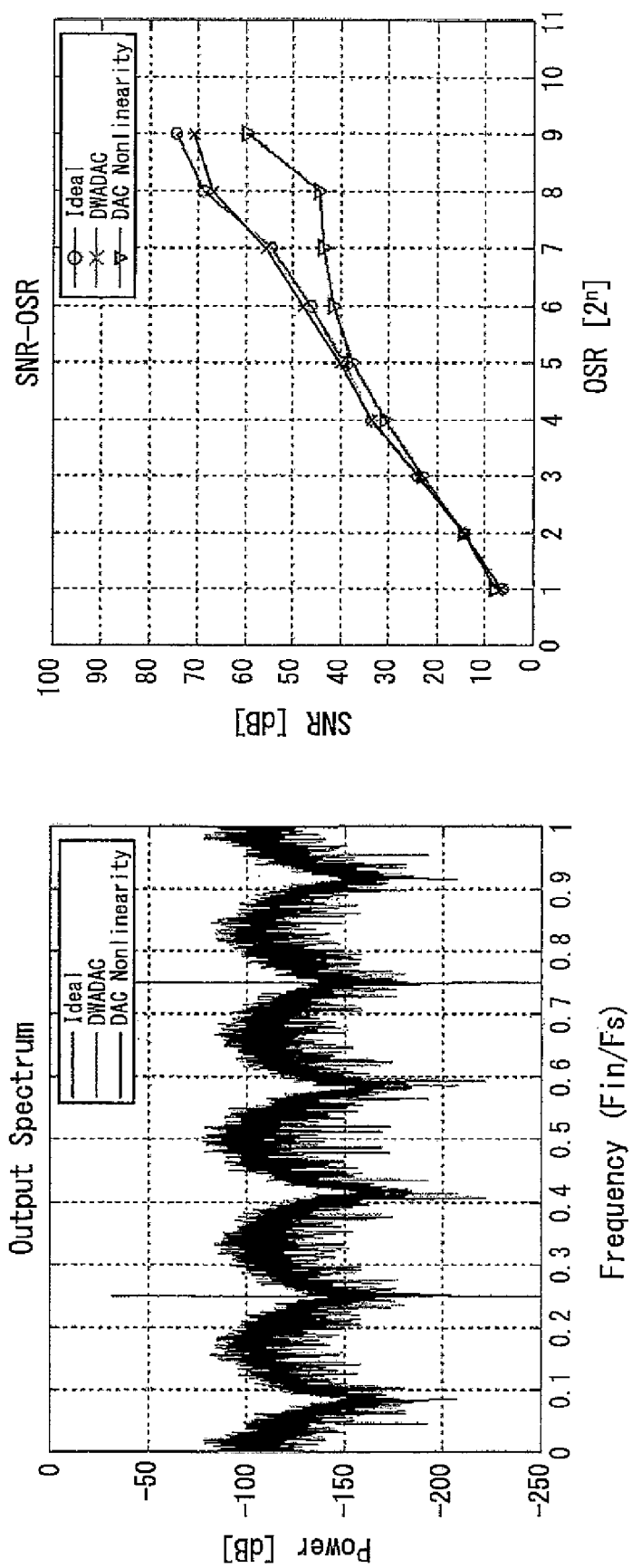
FIG. 12 is composed of graphs showing the output spectrum (a) and the SNR relative to the OSR for a case where the order of the HP filter is "6" in the first embodiment of the present invention.

As described earlier, although FIG. 7 shows a simulation where the order N of the band pass filter is set at "4", N=4 is merely one example, and FIG. 8 to FIG. 10 show the output spectrum and SNR for the cases where N is "1", "2", and "3". FIG. 11 to FIG. 14 show the case where the value of n exceeds "4", that is where N is "5", "6", "7", and "8". As can be understood from any of these drawings, nonlinear noise is subjected to noise shaping when a DWADAC is used.

Next, as a second embodiment of the present invention, an example where a multi-band pass filter (hereinafter abbreviated to "LP filter") that has N zero points and includes a DC component in an N-order signal band is used will be described.

FIG. 15(a) is a block construction diagram showing the construction of a multi-band pass ΔΣ modulator for carrying out analog-digital conversion using a DWADAC, for the case where a multi-band pass filter 21 that has N zero points and includes a DC component in an N-order signal band is used. FIG. 15(b) is a graph showing the relationship between signal frequencies in the frequency band and the noise level.

As shown in FIG. 15(a), in this second embodiment, an input analog signal X(Z) is supplied to one terminal of a subtractor 20, and a value produced by converting an output digital signal Y(Z) to an analog signal is subtracted. An analog signal of the value produced by subtraction is supplied via a multi-band pass filter 21 (hereinafter abbreviated to "LP filter" for convenience) that has N zero points and includes a DC component in an N-order signal band to a multiple-bit ADC 22. The output of the multiple-bit ADC 22 is outputted as the output digital signal Y(Z) and is also supplied to a DWADAC 23 and fed back to the other terminal of the subtractor 20.

Here, since the transmission function of the multi-band pass filter 21 that has N zero points and includes a DC component in an N-order signal band can be expressed as $H(Z)=Z^{-N}/(1-Z^{-N})$ where N is the order of the filter, by substituting this into Equation (1), Equation (8) is given.

Equation (8)

$$Y(Z)=Z^{-N}\cdot\{X(Z)-\delta(Z)\}+E(Z)(1-Z^{-N}) \qquad (8)$$

(where E(Z) is the quantization noise and δ(Z) is the nonlinear noise of the DAC)

Accordingly, the STF (Signal Transfer Function) and NTF (Noise Transfer Function) are as shown in Equations (9) and (10) below.

Equation (9)

$$STF=Z^{-N} \qquad (9)$$

Equation (10)

$$STF=1-Z^{-N} \qquad (10)$$

As should be obvious, in Equations (9) and (10), the sum of STF and NTF is 1. In Equations (9), (10), the center frequencies $f_n$ of the plurality of signal bands where STF=1 and NTF=0 are given by $f_n=nf_s/N$ (where n=0, 1, 2, ..., $f_s$ is the sampling frequency, and N is the order of the filter).

From FIG. 15(b), in the same way as with FIG. 1(b), it can be understood that there is a remarkable reduction in quantization noise near the center frequencies of the signal bands.

Figure 15:
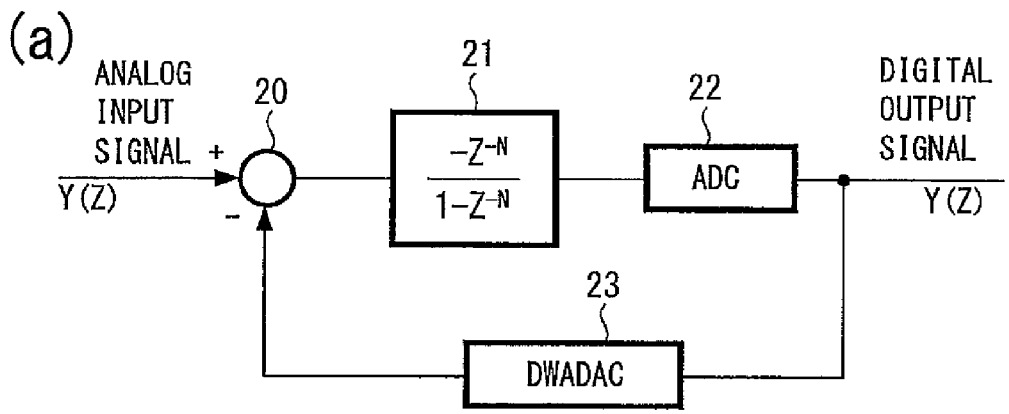
FIG. 15 is a block diagram of a ΔΣ AD modulator that uses a multi-band pass filter (HP filter) that has N zero points and includes a DC component in an N-order signal band, which is a second embodiment of the present invention.
Figure 16:
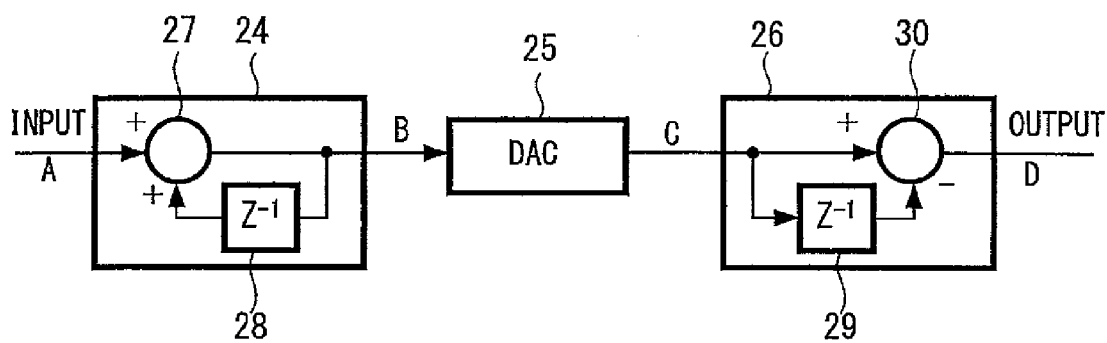
FIG. 16 is an image diagram an LP block construction that constructs the pointer of the DWADAC of the second embodiment of the present invention.

FIG. 16 shows an LP image block construction that constructs a pointer of the DWADAC 23 used in a ΔΣ modulator that uses a multi-band pass filter that has N zero points and includes a DC component in an N-order signal band shown in FIG. 15(a) (note that the construction of the DWADAC is the same as in FIG. 2, but the construction of the pointer 6 differs). In this LP image block construction diagram, a digital integration circuit 24 is provided before a DAC 25 and an analog differentiation circuit 26 is provided after the DAC 25.

First, the input digital signal A is supplied to an adder 27 of the digital integration circuit 24. This adder 27 adds the data that was inputted in the immediately preceding input and is supplied via a delay circuit 28 to the newly inputted data. The digital integration circuit 24 is constructed by a feedback loop that passes the adder 27 and the delay circuit 28. The integrated digital signal B is converted to an analog signal C by a normal digital analog converter 25, and the converted analog signal C is supplied to one terminal of a subtractor 30. This analog signal C is also provided to the other terminal of the subtractor 30 via a delay circuit 29. The analog differentiation circuit 26 is constructed from the subtractor 30 and the delay circuit 29. Accordingly, the analog output signal D from the subtractor 30 is an analog signal produced by subtracting the data inputted in the immediately preceding input from the inputted data, or in other words, a differential analog signal.

The operation of this circuit will now be described with reference to FIG. 17(a) to FIG. 17(c). FIG. 17(a) is a diagram showing the case where the number of segment elements of the DAC is infinite, while FIG. 17(b) shows the case where the number of segment elements of the DAC is eight. In this case, an LP algorithm that makes a loop and returns to the start is executed. Here, let us suppose the case where "3" is continuously supplied as the digital input A. First, when "3" is provided as the digital input A, since the output of the delay circuit 28 at that time is "0", the output of the adder 27 also remains at "3". Accordingly, the DAC elements 0, 1, 2 are switched on (shown by the symbol "+" in FIG. 17(a)). Next, when "3" is supplied to the input A again, the "3" that has already been stored via the delay circuit 28 is added so that the output of the adder 27 becomes "6", so that "6" is outputted from the DAC 25 as the analog signal C. That is, the segment elements 0 to 6 that construct the DAC 25 are switched on.

The output C of the DAC 25 is supplied to one terminal of the subtractor 30 that constructs the analog differentiation circuit and in the same way, the immediately preceding value is supplied via the delay circuit 29 to the other terminal of the subtractor 30. This means that the analog output D obtained from the subtractor 30 is the value produced by subtracting the "3" that has already been stored from the inputted "6", which gives "3". Next, when the digital input A (="3") is supplied, since the immediately preceding output "6" of the adder 27 is added to the newly inputted "3", the output of the adder 27 becomes "9". However, in the subtractor 30, since the immediately preceding value "6" is subtracted from the analog output "9" of the DAC 25, "3" is obtained as the analog output D. In this way, although "3" is constantly outputted as the analog output when "3" is successively provided as the input, out of the segment elements of the DAC 25, a procedure where the segment elements 0 to 2 are switched on first, the segment elements 3 to 5 are switched on next, the segment elements 6 to 8 are switched on after this, and then the segment elements 9 to 11 are switched on continues ad infinitum.

However, since it is impossible to provide infinite segment elements in the DAC 25, if it is supposed that a DAC with eight segment elements is used, when the third group of the segment elements 6 to 8 are switched on, the segment elements are reset and the procedure returns to the start. That is, for the third input of "3", the segments 6, 7, 0 are switched on. This is shown in FIG. 17(b). Accordingly, when the fourth digital input A of "3" is provided, the segment elements 1 to 3 are switched on. With this method, out of the eight segments, a number of segments equal to the value of the input digital signal are successively switched on. This method can be realized by forming the segment elements that construct the DAC 25 in a ring and by switching on the segment elements in order. FIG. 17(c) shows the relationship between the values A, B, C, D in the LP block construction diagram shown in FIG. 16. From this diagram, it can be understood that the input digital signal A is converted to a digital signal output D of the same value regardless of the intermediate path (B, C).

Figure 17:
FIG. 17 is a diagram useful in explaining the operation of the LP block construction shown in FIG. 16.
Figure 18:
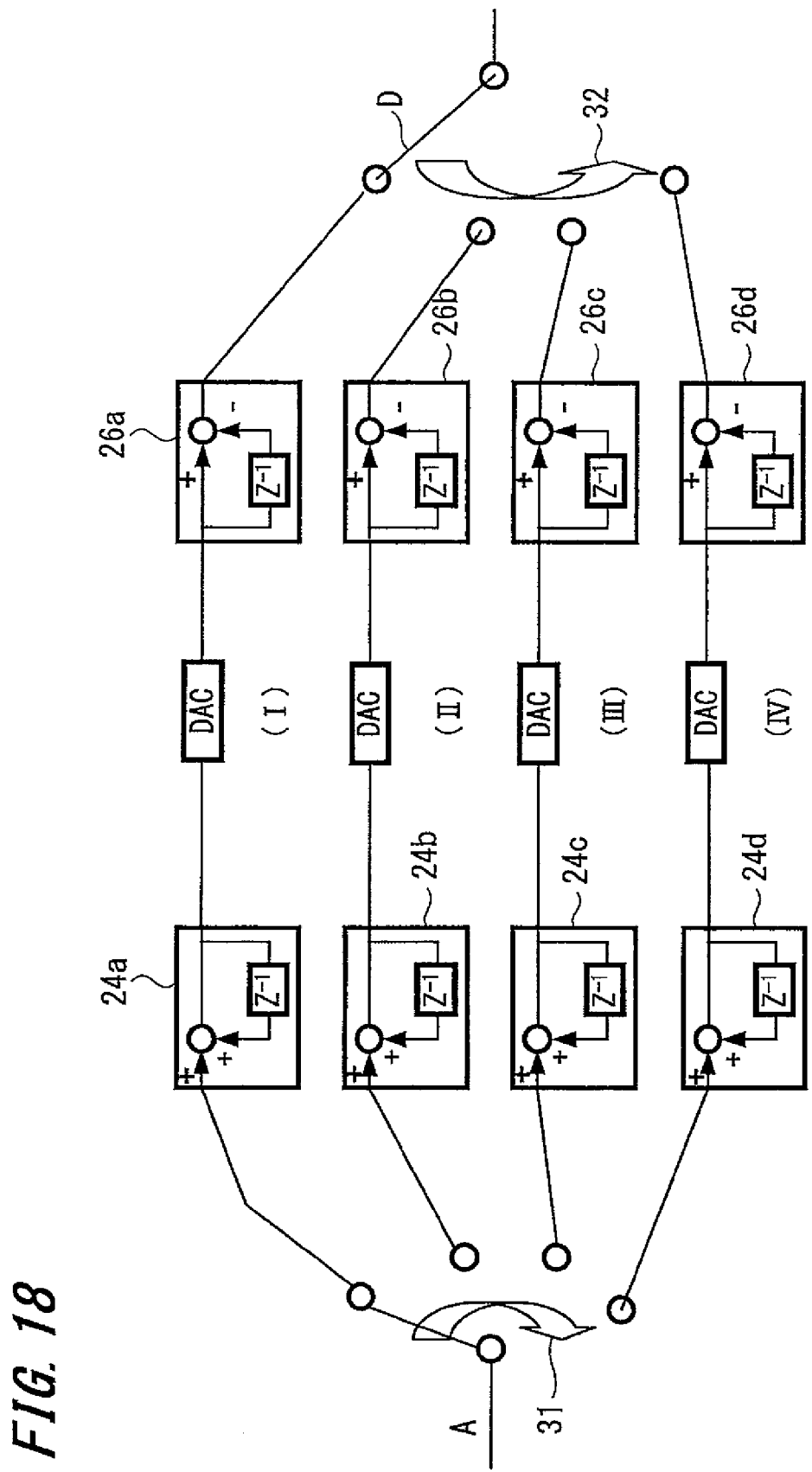
FIG. 18 is an image diagram that uses a plurality (four) of LP block constructions as the pointers of the DWADAC used in the second embodiment of the present invention.
Figure 19:
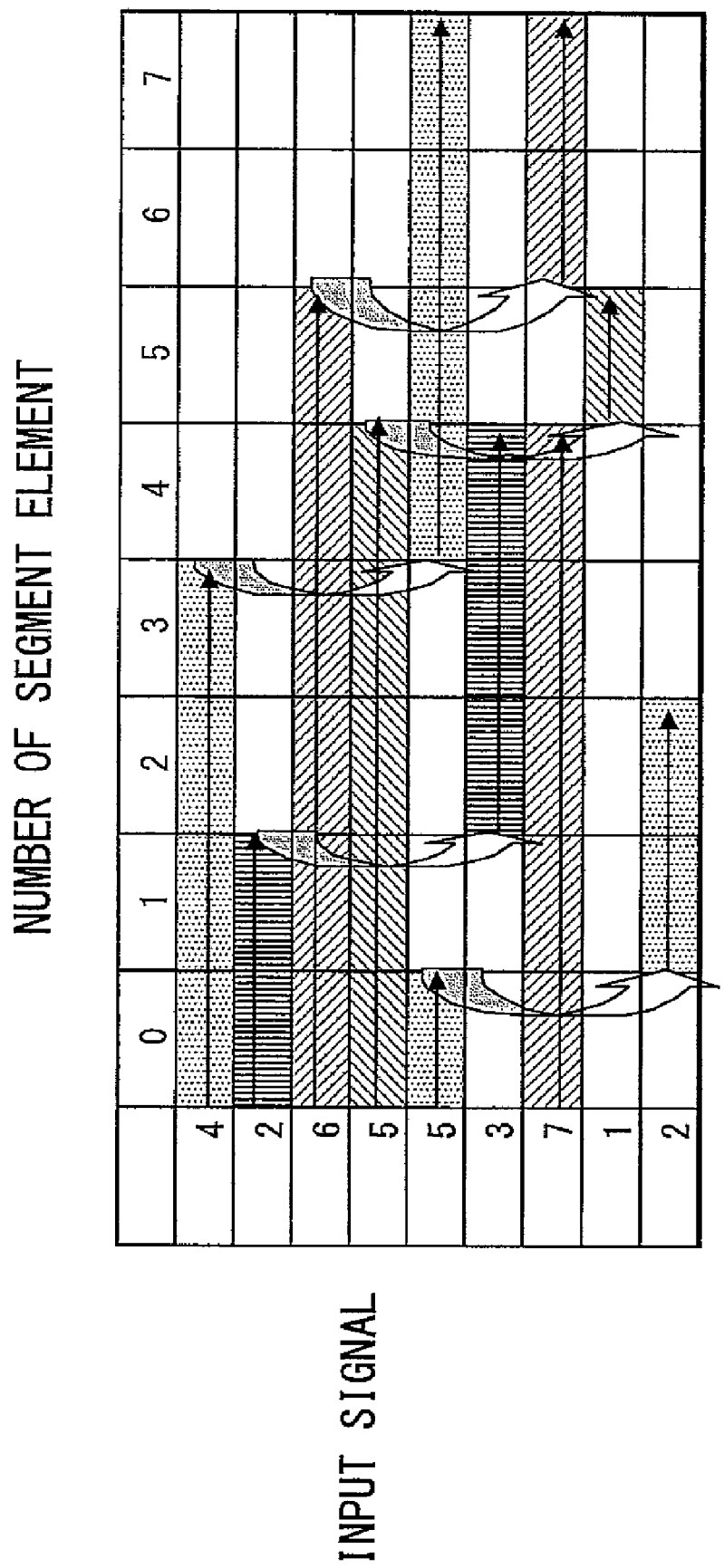
FIG. 19 is a diagram useful in explaining the operation of the DWADAC according to the present invention shown in FIG. 5.

FIG. 18 and FIG. 19 are an image block construction diagram and a diagram useful in explaining the operation of a case where a plurality (for example, four) pointers are provided for the DWADAC of a ΔΣ modulator that uses a multi-band pass filter that has N zero points and includes a DC component in an N-order signal band, which is the second embodiment of the present invention shown in FIG. 15. In this DWADAC 23 also, the pointers that construct the DWADAC 23 are set in parallel in accordance with the center frequencies of the multi-band pass filter 21, and in this case the number of pointers is N in accordance with the order N of the multi-band pass filter 21. Since this LP block image construction diagram has already been described with reference to FIG. 16 and FIG. 17, description thereof is omitted here, and the operation for a case where a plurality (four) of such constructions are used will now be described with reference to FIG. 19.

The plurality of DAC(I) to (IV) shown in FIG. 18 are supplied in order with inputted digital signals. That is, the digital input A is supplied via a switch 31 to the digital integration circuits 24a to 24d disposed before the respective DACs (I) to (IV). The analog differentiation circuits 26a to 26d that are connected after the DACs (I) to (IV) are connected to a switch 32 and analog output C from the DAC(I) to DAC(II) is fetched via the switch 32 as the analog output D. For example, as shown in FIG. 19, when input digital signals are supplied in the order "4, 2, 6, 5, 5, . . . ," as the digital input A, "4" is supplied to the DAC (I), "2" is supplied to the DAC (II), "6" is supplied to the DAC (III), and "5" is supplied to the DAC (IV). The next digital input "5" is supplied to the DAC (I) again. This is the same as the case described with reference to the four HP block construction diagram (FIG. 5).

When the order N of the multi-band pass filter (LP filter) 21 that has N zero points and includes a DC component in an N-order signal band shown in FIG. 15(a) is fixed and the passbands of the filter are determined, the number of pointers (corresponding to the pointer 6 shown in FIG. 2) in the DWA-DAC 23 is set equal to the order N of the filter. Here, assume that the order N of the LP filter 21 is set at four and that four LP block image constructions are used as the pointers of the DWADAC 23 in accordance with the order of the filter.

First, when "4" is inputted into the digital input A, since the digital input A is supplied via the switch 31 to the DAC (I), as shown in FIG. 19 and in the same way as described with reference to FIG. 16 and FIG. 17, the segment elements 0 to 3 of the DAC (I) are switched on. Next, when the digital signal A (="2") is inputted, the signal is inputted into the LP block construction of the DAC (II) and the segment elements 0, 1 thereof are switched on. After this, when the digital signal A (="6") is inputted, the signal is inputted into the LP block construction of the DAC (III) and the segment elements 0 to 5 thereof are switched on. Also, when the digital signal A (="5") is inputted next, the signal is inputted into the LP block construction of the DAC (IV) and the segment elements 0 to 4 thereof are switched on.

By doing so, digital signals are stored in all of the DAC (I) to the DAC (IV), and the digital signal A (="5") inputted next is inputted into the DAC (I) into which a signal was inputted first. Since the LP block construction of the DAC (X) operates at this time as described earlier with reference to FIGS. 17(a) to (c), in the DAC (I) five segment elements are switched on in the order of the segment elements 4, 5, 6, 7, 0. Here, the procedure starts at the starting point 3 indicated by the pointer and proceeds forward to the segment elements 4, 5, 6, 7 before finally returning to 0. When the next input signal is inputted into the DAC (I), the first segment element, segment element 0, is the starting point.

In the same way, when the digital input A (="3") is supplied next, the signal is inputted via the switch 31 into the DAC (II) and the segment elements 2, 3, 4 are switched on. Also, when the digital input ("7") is supplied, the DAC (III) operates and the segment elements 6, 7, 0, 1, 2, 3 are switched on with the fifth segment element as the starting point. After this, when the digital signal A (="1") is inputted next, only the segment element 3 is switched on with the segment element 4 of the DAC (IV) as the starting point. Next, when the digital signal "2" is inputted, the procedure returns to the DAC (I) and the segment elements 1, 2 are switched on starting from 0 as the starting point. In this way, the DACs (I) to (IV) that are a plurality of LP block constructions successively operate and thereby a digital-analog conversion process is carried out.

FIG. 20(a) is a graph showing the output spectrum (dB: output/frequency) when the DWADAC 23 illustrated in FIG. 15(a) is constructed of four DACs (I) to (IV) and the order of the multi-band pass filter 21 that has N zero points and includes a DC component in an N-order signal band is "4" (that is, n=4). FIG. 20(b) is a graph showing the value of the SNR (Signal Noise Ratio) relative to the OSR (Over Sampling Ratio) at this time. In FIG. 20(b), the line marked with the circles shows the SNR in the ideal state where there is no nonlinear noise and the line marked with the triangles shows the case where there is nonlinear noise and a normal DAC is used. The line marked with the crosses shows the case where the DWADAC according to the present embodiment is used. As can be understood from FIG. 20(b), when a DWADAC is used as in the present embodiment, even when nonlinear noise is present, an SNR that is extremely close to the case (shown by the circles) where no nonlinear noise is present is achieved. That is, the efficacy of the use of a DWADAC as a feedback DAC was confirmed even in a ΔΣ modulator that uses a multi-band pass filter 21 that has N zero points and includes a DC component in an N-order signal band.

In the description above, although a simulation where the order N of the multi-band pass filter in FIG. 15 is set at "4" has been taken as an example, N=4 is merely one example, and FIG. 21 to FIG. 23 show the output spectrum and SNR for the cases where N is "1", "2", and "3". FIG. 24 to FIG. 27 show the cases where the value of n exceeds "4", that is where N is "5", "6", "7", and "8". As can be understood from any of these drawings, even in a ΔΣ modulator including a multi-band pass filter that has N zero points and includes a DC component in an N-order signal band, in the same way as in a ΔΣ modulator including a multi-band pass filter that does not include a DC component (see FIG. 1), nonlinear noise is subjected to noise shaping when a DWADAC is used.

Figure 28:
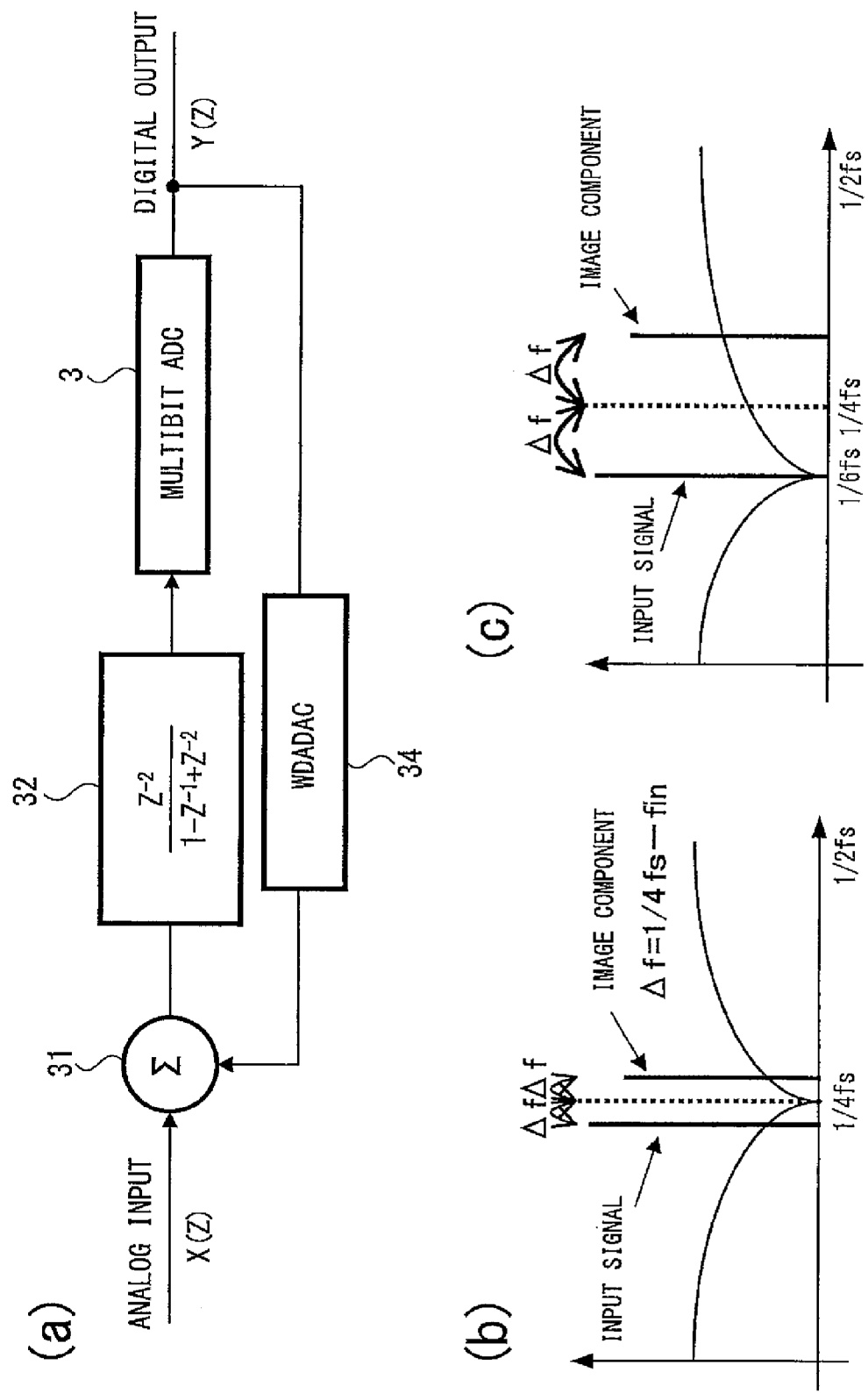
FIG. 28 is a block construction diagram showing a third embodiment of the present invention.

A ΔΣ modulator according to the present invention can also be realized by a circuit block construction such as that shown in FIG. 28(a).

FIGS. 28(b) and (c) are graphs useful in explaining the ΔΣ modulator for a case where a signal frequency $f_{in}$ is displaced from the center frequency of a signal band, $f_s/4$, for example, due to nonlinearity of the internal circuits that construct the ΔΣ modulator.

As shown in FIG. 28(b), if the input signal frequency becomes $f_{in}=(f_s/4)-\Delta f$ due to the reasons described above, an image signal will be produced at a position found by folding over centered on $f_s/4$ that is the center frequency of the signal band. Since this image signal also falls within the signal band, there is the problem of deterioration in the SNDR (Signal Noise Distortion Ratio). To solve this problem, the center frequency of the signal band is set aside from $f_s/4$ at $f_s/6$, for example. FIG. 28(c) is a graph showing the case where the center frequency of the signal band has been set at $f_s/6$. In this way, by setting the center frequency of the signal band at a point aside from $f_s/4$, the folding over of an image component due to nonlinearity is excluded from the signal band. To realize this type of ΔΣ modulator, the transmission function H(Z) of the filter 32 shown in FIG. 28(a) is set as shown in Equation (11).

In the circuit block construction shown in FIG. 28(a), the analog input X(Z) is supplied to one terminal of a subtractor 31 and an analog output of a DWA multibit DAC 34 supplied to the other terminal of the subtractor 31 is subtracted. The output of the subtractor 31 is supplied to the filter 32, is subjected to processing by the filter 32, and is then supplied to a multibit ADC 33. The output of the multibit ADC 33 is fetched as the digital output Y(Z) and is also supplied to the DWA multibit DAC 34 and converted to an analog signal.

Equation (11)

$$H(Z) = \frac{-Z^{-2}}{1 - Z^{-1} + Z^{-2}} \quad (11)$$

By using this transmission function H(Z), it is possible to set the center frequency of the signal band at $f_s/6$.

Figure 29:
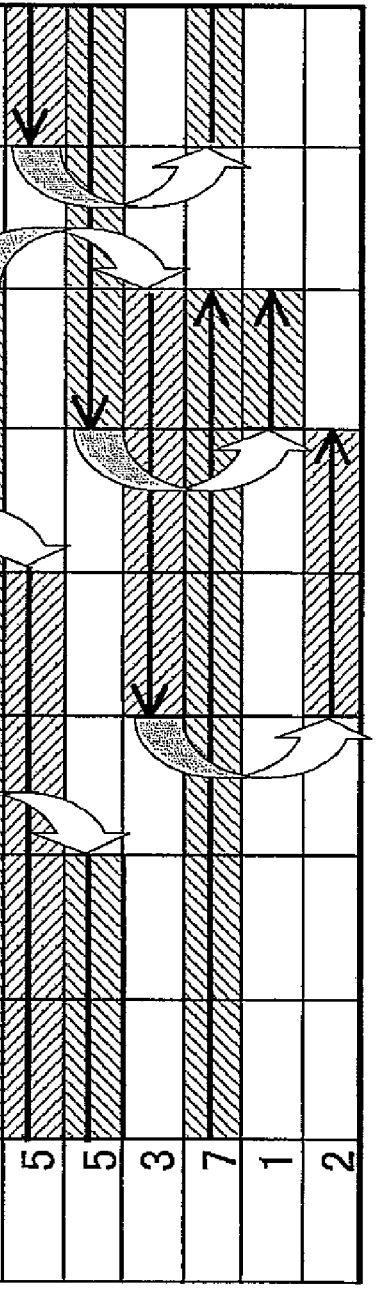
FIG. 29 is a diagram useful in explaining the operation of the third embodiment of the present invention (for a case where three HP pointers are used).

FIG. 29 is a graph showing the operation of the DWADAC 34 for a case where, in the ΔΣ modulator shown in FIG. 28(a), a multi-band pass algorithm has been applied to a band pass filter constructed so that $f_s/6$ (2N=6) is the center frequency.

In this example, the pointers of the DWADAC 34 are set in parallel in accordance with the center frequencies of the band pass filter 32, and when the center frequency is $f_s/6(2N=6)$, three pointers are required. The operation of the DWADAC in this case can be thought of as switching between the DAC (I) to the DAC (III) such as those shown in FIG. 5 in order in accordance with the input signal. Even when a band pass filter where the center frequency of the signal band is away from $f_s/4$ is used, in the same way as when the multi-band pass filters shown in FIG. 1(a) and FIG. 15(a) are used, it is possible to use a DWADAC and by doing so, it is possible to reduce nonlinear noise.

That is, when the input signals are supplied in the order "4, 2, 6, 5, 5, 3, 7, 1, 2", first "4" is supplied by the digital input A to the DAC (I) and as shown in FIG. 29, the segment elements 0 to 3 of the DAC (I) are switched on. Next, when the digital signal A (="3") is inputted, the segment elements 0, 1 of the DAC (II) are switched on. After this, when the digital signal A (="6") is inputted, the segment elements 0 to 5 of the DAC (III) are switched on.

When the digital signal A (="5") is inputted next, the segment elements of DAC(I) are switched on again, but at this time, five segment elements are switched on in the DAC(I) in the order "3, 2, 1, 0, 7" starting from the segment element 3.

When the digital signal "5" is inputted, the DAC(II) is switched on, but in the DAC(II) at this time, as shown in the drawing, the segment elements are switched on in the order "1, 0, 7, 6, 5" with the segment element 1 as the starting point. Next, when the digital signal "3" is inputted into the DAC (III), the segment elements in the DAC(III) are switched on in the order "5, 4, 3". After this, the digital signal input "7" is supplied to the DAC(I), the digital input "1" is supplied to the DAC(II), and the digital input "2" is supplied to the DAC(III), and the operation shown in FIG. 29 is carried out.

FIG. 30 is a graph showing the output spectrum (dB: output/frequency) of a ΔΣ modulator for a case where the center frequency of the signal band is set at $f_s/6$ as shown in FIG. 28(a) and the value of the SNR (Signal Noise Ratio) relative to the OSR (Over Sampling Ratio) at this time. In FIG. 30(b), the line marked with the circles shows the SNR in the ideal state where there is no nonlinear noise, and the line marked with the triangles shows the case where there is nonlinear noise and a normal DAC is used. The line marked with the crosses shows the case where the DWADAC 4 according to the present embodiment is used. As can be understood from FIG. 30(b), when a DWA multibit DAC is used like in the present embodiment, even when nonlinear noise is present, an SNR that is extremely close to the case (shown by the circles) where no nonlinear noise is present is achieved. That is, for the case where three HP pointers are used, the efficacy of the use of a DWADAC as a feedback DAC can be confirmed even in a band pass ΔΣ modulator that uses the band pass filter 32 that uses the transmission function H(Z) shown in Equation (11).

Here, although $f_s/6$ has been described as one example of the center frequency of the signal band in the embodiment shown in FIG. 28(a), it should be obvious that the center frequency is not limited to $f_s/6$ and that an arbitrary frequency aside from $f_s/4$ may be used. There is also an advantage when a center frequency that is equal to or above $f_s/2$ but no greater than $f_s$, such as $3f_s/4$ or $7f_s/8$ is used as the center frequency of the signal band in that it is possible to achieve AD conversion at a low sampling frequency. This method is called "subsampling". Even when subsampling is carried out, it is still possible to reduce the nonlinearity of the DAC by using a DWA-DAC with a multi-band pass algorithm in the same way as when the image signal described above is avoided.

Figure 31:
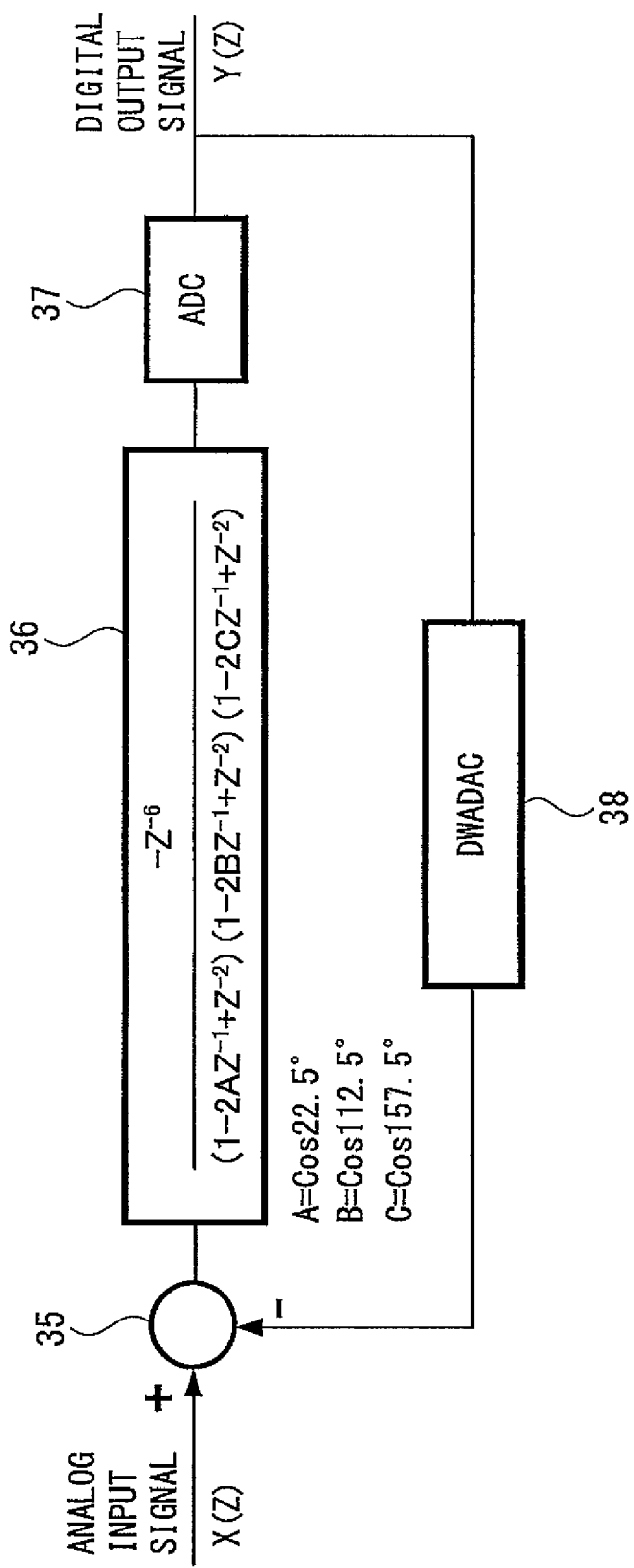
FIG. 31 is a block construction diagram showing a fourth embodiment of the present invention where the signal band can be selected.

When a filter with the transmission function shown by Equation (12), for example, is used in place of the band pass filter 32 shown in FIG. 28(a), it is possible to realize a ΔΣ modulator where the carrier can be selected. A block construction diagram that realizes this is shown in FIG. 31.

Equation (12)

$$H(Z) = \frac{-Z^{-6}}{(1 - 2AZ^{-1} + Z^{-2})(1 - 2BZ^{-1} + Z^{-2})} \quad (12)$$
$$(1 - 2CZ^{-1} + Z^{-2})$$

(where, $A = \cos 22.5°$, $B = \cos 112.5°$, $A = \cos 157.5°$)

Note that the filter with the transmission function shown in Equation (12) is merely one example, and that it should be obvious that the filter can be appropriately designed in accordance with the set band.

FIG. 31 shows a construction where the center frequency of the signal band of a multi-band pass filter is selected by changing the filter part of the ΔΣ modulator. In this multi-band pass ΔΣ modulator, when, for example, a filter with the order 8 is used as the HP filter, it is possible to select carriers that have $f_s/16$, $3f_s/16$, $5f_s/16$, $7f_s/16$ as the center frequencies of the signal bands.

First, the reason why it is necessary to select only certain frequencies as the center frequencies of the signal bands will now be described. A band that is difficult to use due to the effect of the transmission lines is normally present in a ΔΣ modulator used for communication, and a problem can often occur whereby noise shaping is carried out for such unused band. This means that in a ΔΣ modulator where a constant amount of quantization noise is generated for a signal, the unnecessary noise shaping for the unused band leads to the problem of deterioration in the SNR (Signal Noise Ratio) in other bands. To solve this problem, by selecting the center frequencies of the signal bands of the filter part according to the $f_s/16$, $5f_s/16$, $7f_s/16$ pattern, for example, it is possible to eliminate unused bands (for example, a band where the center frequency is $3f_s/16$). In this way, by selecting the bands, it is possible to avoid unnecessary noise shaping and to thereby increase the effect of the noise shaping in the selected bands.

In the circuit block construction shown in FIG. 31, the analog input X(Z) is supplied to one terminal of a subtraction circuit 35, and here an analog output of a DWA multibit DAC 38 supplied to the other terminal of the subtraction circuit 35 is subtracted. The output of the subtraction circuit 35 is supplied to a filter 36 that has the transmission function shown by Equation (12), is subjected to processing by the filter 36, and is supplied to a multibit ADC 37. The output of the multibit ADC 37 is fetched as the digital output Y(Z) and is supplied to the DWA multibit DAC 38 and converted to an analog signal.

In this ΔΣ modulator shown in a fourth embodiment, a multi-band pass algorithm is applied to a multi-band pass filter where $f_s/16$, $5f_s/16$, $7f_s/16$ are selected as the center frequencies. As the DWADAC 38 in this case, eight DAC shown in FIG. 5 are required as DAC (I) to DAC (VIII), and these eight pointers are switched in order in accordance with the input signal. In the present embodiment also, the pointers that construct the DWADAC 38 are set in parallel in accordance with the center frequencies of the multi-band pass filter 36. In this way, in a multi-band pass filter with the center frequencies selected in this way, in the same way as when the multi-band pass filters shown in FIG. 1(a) and FIG. 15(a) are used, it is possible to use a DWADAC, and by doing so it is possible to reduce nonlinear noise.

Note that although the case where a multi-band pass filter where 2N=16 and the center frequencies are selected as $f_s/16$, $5f_s/16$, $7f_s/16$ is used has been described in this embodiment, normally in $(2n+1)f_s/2N$, it is possible to arbitrarily set n=0, 1, 2, 3, . . . and the filter order N. The setting of N=8, the setting of n=0, 2, 3, and the decision not to use the signal band that has a center frequency $3f_s/16$ where n=1 as the center frequency as in the present embodiment are all merely one example, and the present invention is not limited to such.

Figure 32:
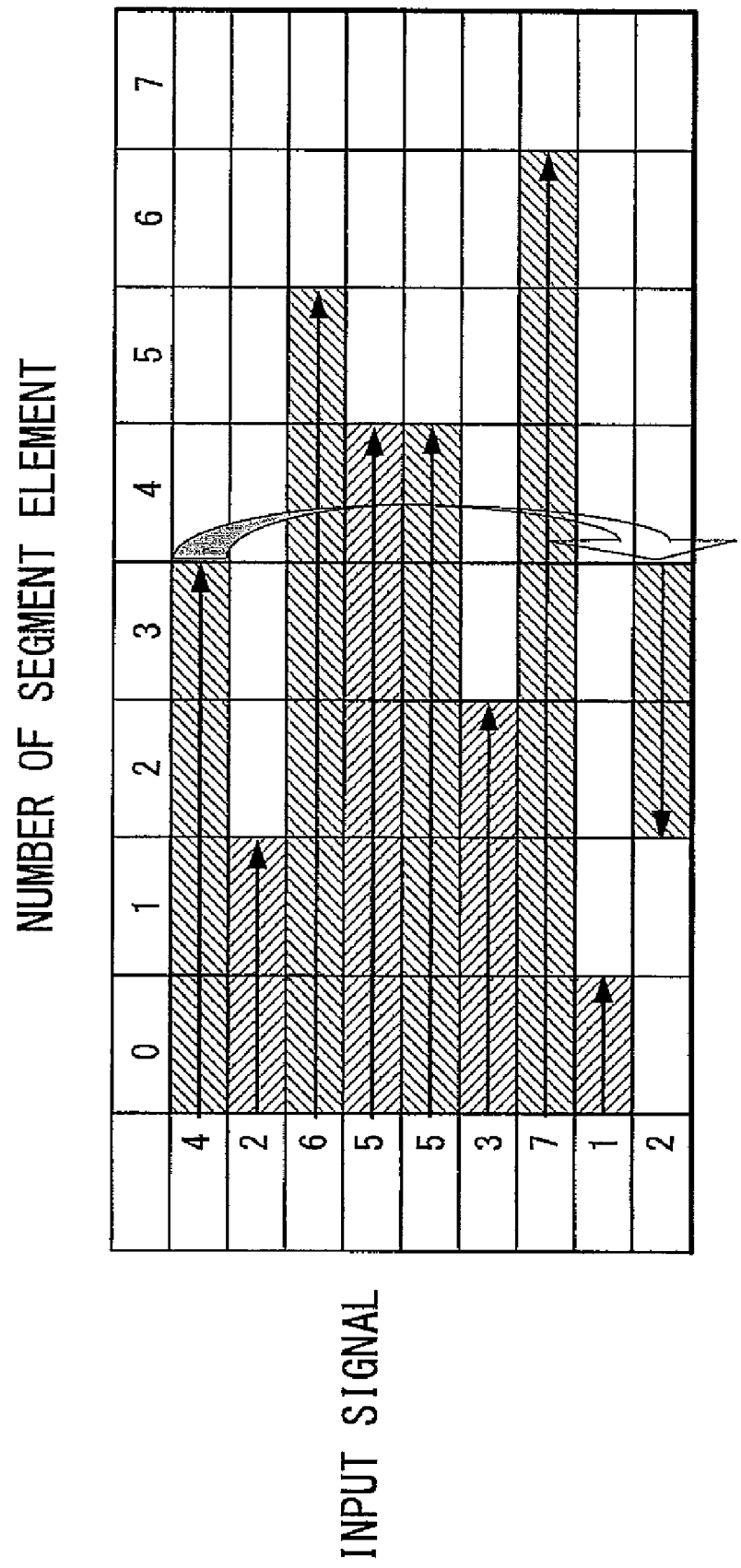
FIG. 32 is a diagram useful in explaining the operation of a DWADAC 38 in FIG. 31.

FIG. 32 is a diagram useful in explaining the operation when 8 pointers are used in the DWADAC 38. First, assume that the digital inputs are supplied in the order "4, 2, 6, 5, 5, 3, 7, 1, 2" to the DWADAC 38. First, "4" is inputted into the DAC (I) by the digital input A, and the segment elements 0 to 3 of the DAC (I) are switched on. Next, the digital signal A (="3") is inputted into the DAC (II), and the segment elements 0, 1 of the DAC (II) are switched on. After this, the digital signal A (="6") is inputted into the DAC (III), and the segment elements 0 to 5 of the DAC (III) are switched on.

In the same way, the digital signals "5, 5, 3, 7, 1" are successively supplied to the DAC (IV) to the DAC (VIII). Since this means that digital inputs have been inputted into every DAC from the DAC (I) to the DAC (VIII), the next digital input "2" is supplied to DAC (I) again. As shown in FIG. 32, since "4" has already been inputted into the DAC (I) the segment elements 0 to 3 of DAC (I) will already be on, and since the pointer will point to the segment element 3, in response to the digital input "2", the segment element 2 is switched on with the segment element 3 as the starting point. That is, the DAC (I) is switched on in the opposite direction to the direction for the preceding input. After this, although not shown in the drawings, the DAC (II) operates in the same way in response to an input and such processing is successively repeated up to the DAC (VIII). The operation of the DWADAC 38 is carried out by the 8 pointers successively operating in this way. By doing so, nonlinear noise (δ noise) that cannot be avoided due to the characteristics of a multibit DAC is suppressed.

Figure 33:
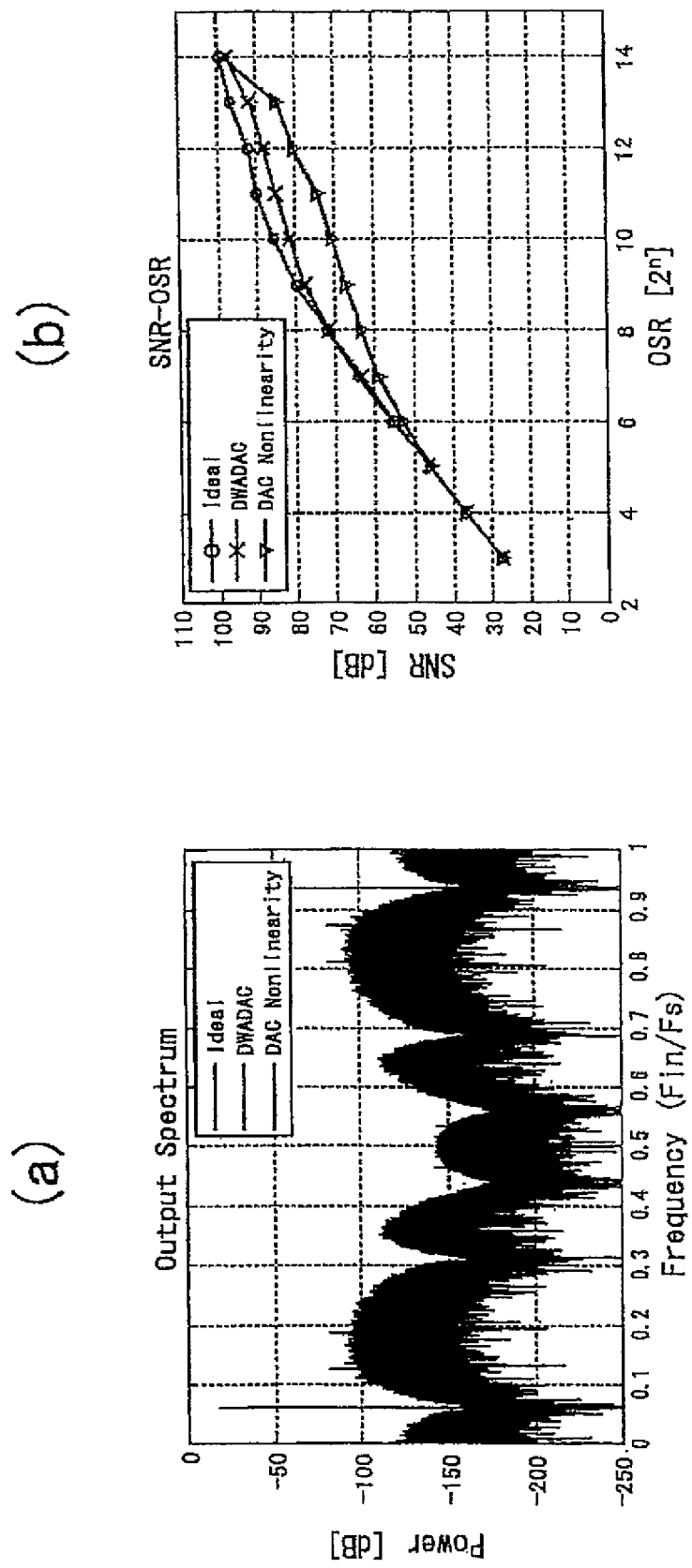
FIG. 33 is composed of graphs showing the output spectrum (a) and the SNR relative to the OSR (b) in the fourth embodiment of the present invention.
Figure 34:
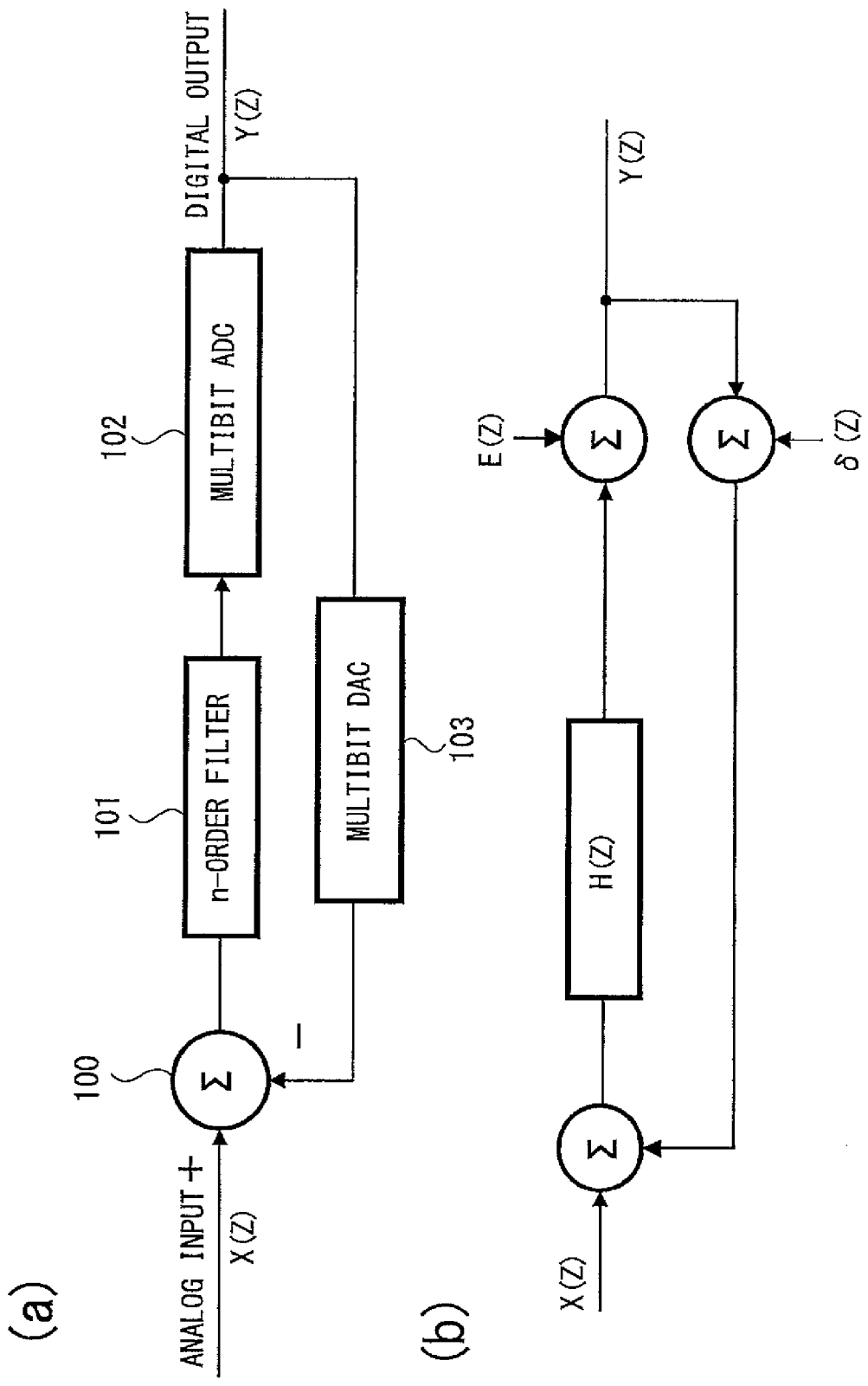
FIG. 34 is a block construction diagram (a) of an existing multibit ΔΣ AD modulator and an equivalent circuit thereof (b).
Figure 35:
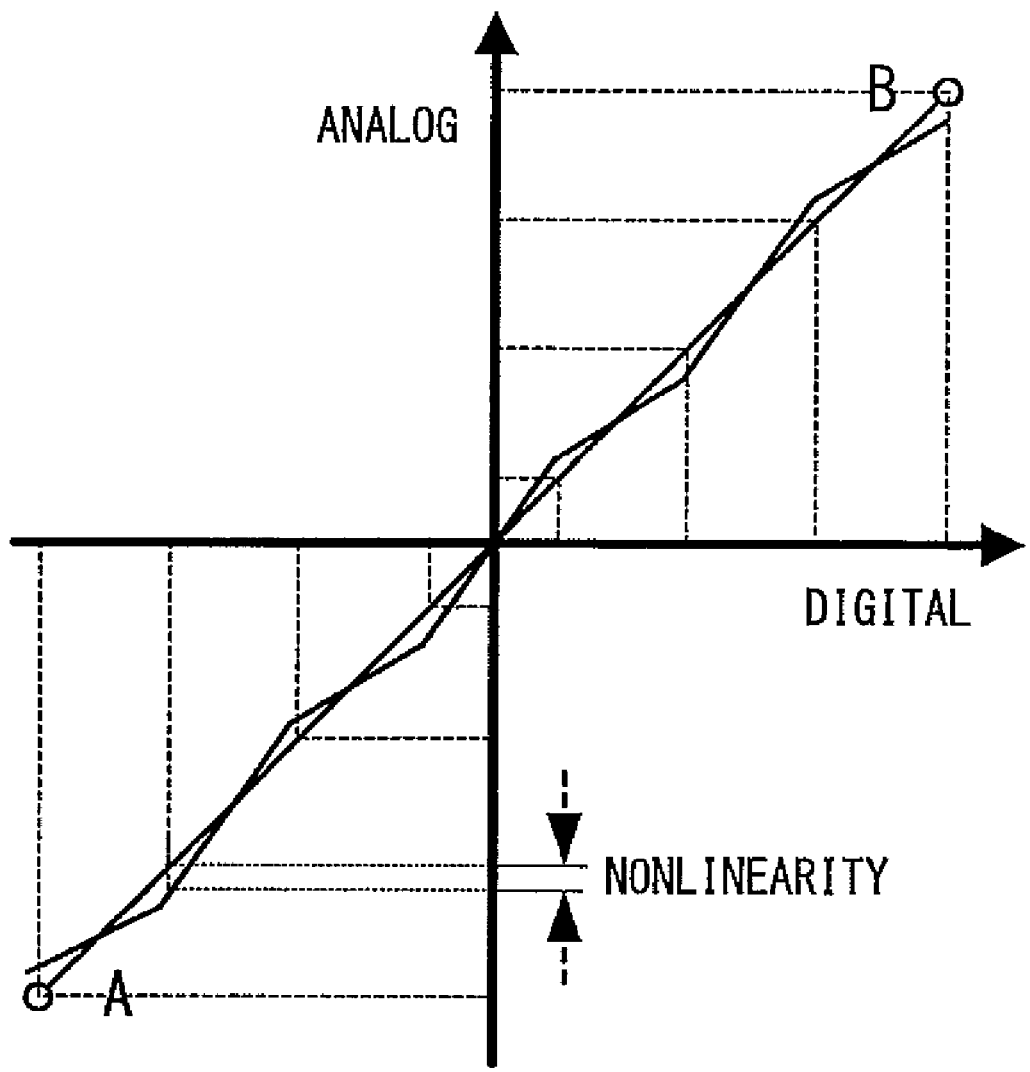
FIG. 35 is a diagram useful in explaining nonlinear noise of a multibit DAC used in an existing multibit ΔΣ AD modulator.
Figure 36:
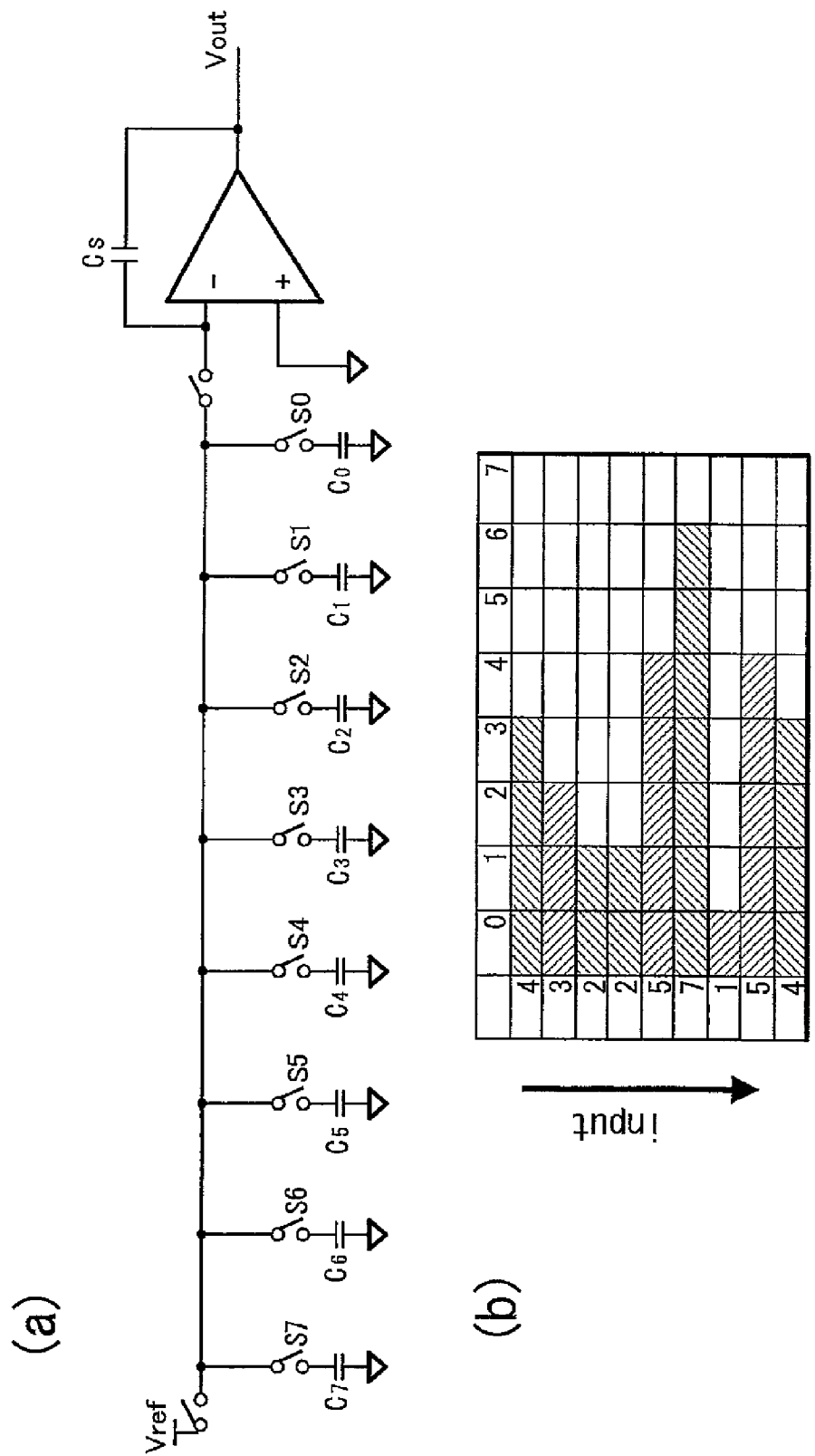
FIG. 36 is a diagram useful in explaining the overall construction of an existing DAC and the operation thereof.
Figure 37:
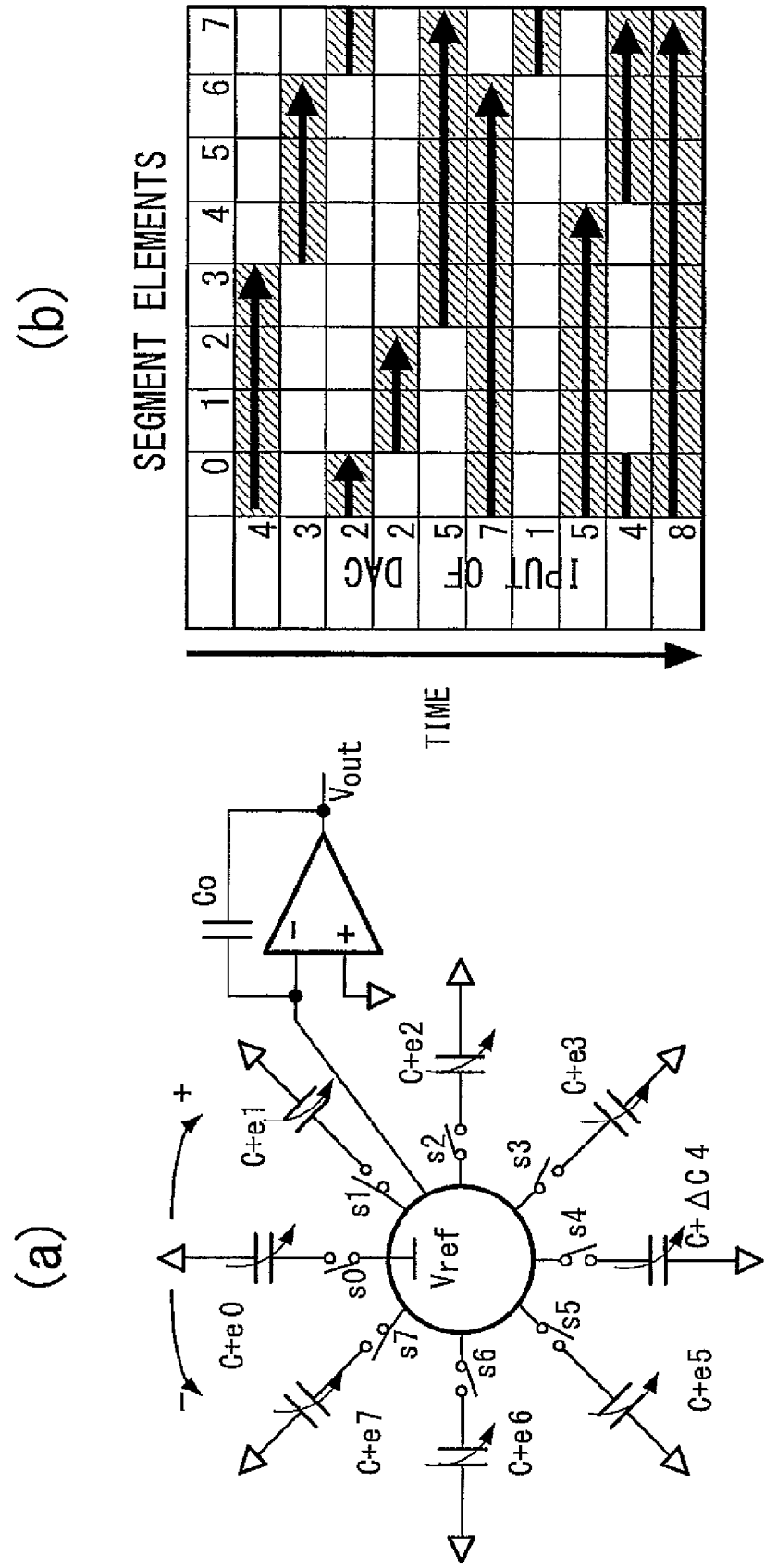
FIG. 37 is a diagram useful in explaining an existing ring-type DAC image and the operation thereof.

FIG. 33 is a graph showing the output spectrum (a) (dB: output/frequency) where eight HP algorithm pointers are applied to a multi-band pass filter constructed so that the center frequencies of the signal bands are set at $f_s/16$, $5f_s/16$, $7f_{s/16}$ (2N=16) in the ΔΣ modulator shown in FIG. 31 and the value of the SNR (b) relative to the OSR at this time. In FIG. 32(b), the line marked with the circles shows the SNR in the ideal state where there is no nonlinear noise, and the line marked with the triangles shows the case where there is nonlinear noise and a normal DAC is used. The line marked with the crosses shows the case where the DWADAC 38 according to the present embodiment is used. As can be understood from FIG. 32(b), when a DWA multibit DAC is used as in the present embodiment, even when nonlinear noise is present, an SNR that is extremely close to the case (shown by the circles) where no nonlinear noise is present is achieved. That is, the efficacy of the use of a DWADAC as a feedback DAC can be confirmed even in a multi-band pass ΔΣ modulator that uses a multi-band pass filter 36 where the signal bands are selected.

The case where a filter (HP filter) with a multi-band pass filter that has N zero points and does not include a DC component in an N-order signal band is used and the case where a filter (LP filter) with a multi-band pass filter that has N zero points and includes a DC component in an N-order signal band is used have both been described above for the ΔΣ modulator according to the present invention.

In addition, a ΔΣ modulator where the center frequency of the signal band is set at $f_s/6$ that differs from $f_s/4$ has also been described. However, the present invention is not limited to the embodiments described above, and it should be obvious that the present invention may include a variety of modifications without departing from the scope of the present invention as defined by the attached claims.

REFERENCE NUMERALS

1, 10, 20, 30, 31, 35 . . . SUBTRACTOR
2 . . . MULTI-BAND PASS FILTER (HP FILTER) THAT HAS N ZERO POINTS AND DOES NOT INCLUDE A DC COMPONENT IN AN N-ORDER SIGNAL BANDS
3, 22, 33, 37 . . . ANALOG-DIGITAL CONVERTER (ADC),
4, 23, 34, 38 . . . WEIGHTED DIGITAL-ANALOG CONVERTER (DWADAC),
5, 8, 25 . . . DIGITAL ANALOG CONVERTER(DAC),
6 . . . POINTER,
7, 26 . . . DIGITAL DIFFERENTIATION CIRCUIT (FILTER),
9, 24 . . . DIGITAL INTEGRATION CIRCUIT (FILTER)
11, 13, 28, 29 . . . DELAY CIRCUIT,
12, 27 . . . ADDER,
21 . . . MULTI-BAND PASS FILTER (LP FILTER) THAT HAS N ZERO POINTS AND INCLUDES A DC COMPONENT IN AN N-ORDER SIGNAL BAND
32 . . . BAND PASS FILTER

The invention claimed is:

1. A ΔΣ modulator comprising:
a subtraction circuit that is supplied with an analog signal;
a multi-band pass filter that has N zero points and is supplied with an output of the subtraction circuit;
an analog-digital conversion circuit that is supplied with an output of the multi-band pass filter that has N zero points and converts the analog signal to a digital signal; and
a digital-analog conversion circuit that converts the digital output from the analog-digital conversion circuit to an analog signal and feeds the converted analog signal back to the subtraction circuit,
wherein DWA (Data-Weighted Averaging) pointers that supply successively inputted digital signals to a plurality of segment elements that construct the digital-analog conversion circuit are provided in parallel in accordance with center frequencies of the multi-band pass filter.

2. A ΔΣ modulator according to claim 1, wherein the DWA pointers are composed of N pointers corresponding to an order N of the multi-band pass filter.

3. A ΔΣ modulator according to either claim 1 or claim 2, wherein the multi-band pass filter that has N zero points is a multi-band pass filter that does not include a DC component in an N-order signal band.

4. A ΔΣ modulator according to claim 3, wherein a transmission function H(Z) of the multi-band pass filter that has N zero points is expressed by the following equation $$H(Z)=-Z^{-N}/(1+Z^{-N}).$$

5. A ΔΣ modulator according to either claim 1 or claim 2, wherein the multi-band pass filter that has N zero points is a multi-band pass filter that includes a DC component in an N-order signal band.

6. A ΔΣ modulator according to claim 5, wherein a transmission function H(Z) of the multi-band pass filter that has N zero points is expressed by the following equation $$H(Z)=Z^{-N}/(1-Z^{-N}).$$

7. A ΔΣ modulator comprising:
a subtraction circuit that is supplied with an analog signal;
a band pass filter that is supplied with an output of the subtraction circuit;

an analog-digital conversion circuit that is supplied with an output of the band pass filter and converts the analog signal to a digital signal; and a digital-analog conversion circuit that converts the digital output from the analog-digital conversion circuit to an analog signal and feeds the converted analog signal back to the subtraction circuit, wherein the band pass filter is set so that a center frequency of the signal band of the filter part is a center frequency aside from $f_s/4$, where a sampling frequency is expressed as $f_s$, and wherein DWA pointers that supply successively inputted digital signals to a plurality of segment elements that construct the digital-analog conversion circuit are provided in parallel in accordance with the center frequency of the band pass filter.

8. A $\Delta\Sigma$ modulator according to claim 7, wherein the frequency of the signal band of the band pass filter is $f_s/6$ and a transmission function H(Z) of the band pass filter is expressed by the following equation $$H(Z)=-Z^{-2}/(1Z^{-1}+Z^{-2}).$$

9. A $\Delta\Sigma$ modulator according to claim 8, wherein the DWA pointers are formed of three pointers.

10. A $\Delta\Sigma$ modulator comprising:

a subtraction circuit that is supplied with an analog signal;

a multi-band pass filter that is supplied with an output of the subtraction circuit;

an analog-digital conversion circuit that is supplied with an output of the multi-band pass filter and converts the analog signal to a digital signal; and a digital-analog conversion circuit that converts the digital output from the analog-digital conversion circuit to an analog signal and feeds the converted analog signal back to the subtraction circuit, wherein center frequencies of signal bands of the multi-band pass filter are constructed such that center frequencies of signal bands of a filter part are composed of center frequencies aside from a center frequency expressed as $f_s/4$ where $f_s$ is a sampling frequency, and when the center frequencies of the signal bands are expressed as $(2n+1)f_s/2N$ or $nf_s/N$, n is a value aside from a certain value, and wherein DWA pointers that supply successively inputted digital signals to a plurality of segment elements that construct the digital-analog conversion circuit are provided in parallel in accordance with the center frequencies of the signal bands of the multi-band pass filter.

11. A $\Delta\Sigma$ modulator according to claim 10, wherein the center frequencies of the signal bands of the multi-band pass filter are constructed of $f_s/16$, $5f_s/16$, and $7f_s/16$ (where 2N=16), and the transmission function (Z) of the multi-band pass filter is expressed by the following equation $$H(Z)=-Z^{-6}/\{(1-2AZ^{-1}+Z^{-2})(1-2BZ^{-1}+Z^{-2})(1-2CZ^{-1}+Z^{-2})\}$$

(where A=cos 22.5°, B=cos 112.5°, C=cos 157.5°).

12. A $\Delta\Sigma$ modulator according to claim 11, wherein the DWA pointers are formed of eight pointers.

* * * * *